US012652864B2

(12) United States Patent　　　　　(10) Patent No.:　US 12,652,864 B2
Nugent, Jr.　　　　　　　　　　　　　(45) Date of Patent:　　Jun. 9, 2026

(54) POWER RECEIVER ELECTRONICS

(71) Applicant: LASERMOTIVE, INC., Kent, WA (US)

(72) Inventor: Thomas Joseph Nugent, Jr., Bellevue, WA (US)

(73) Assignee: LaserMotive, Inc., Kent, WA (US)

( * ) Notice: Subject to any disclaimer, the term of this patent is extended or adjusted under 35 U.S.C. 154(b) by 0 days.

(21) Appl. No.: 18/997,384

(22) PCT Filed: Jul. 21, 2023

(86) PCT No.: PCT/US2023/070783
§ 371 (c)(1),
(2) Date: Jan. 21, 2025

(87) PCT Pub. No.: WO2024/064443
PCT Pub. Date: Mar. 28, 2024

(65) Prior Publication Data
US 2026/0033019 A1　　Jan. 29, 2026

Related U.S. Application Data

(60) Provisional application No. 63/369,146, filed on Jul. 22, 2022.

(51) Int. Cl.
H10F 19/90　　　(2025.01)
H10F 19/50　　　(2025.01)
(52) U.S. Cl.
CPC ........... H10F 19/904 (2025.01); H10F 19/50 (2025.01)

(58) Field of Classification Search
CPC ...... H10F 19/904; H10F 19/50; H02J 50/402; H02J 50/30
See application file for complete search history.

(56) References Cited

U.S. PATENT DOCUMENTS

| | | | |
|---|---|---|---|
| 5,637,155 A | 6/1997 | Inoue | |
| 10,651,787 B2 * | 5/2020 | Catthoor ................... | H02J 3/38 |
| 11,799,043 B2 | 10/2023 | Han et al. | |
| 2009/0101194 A1 | 4/2009 | Kare | |
| 2013/0068277 A1 | 3/2013 | Kataoka et al. | |
| 2013/0240012 A1 * | 9/2013 | Yaoi .......................... | H02J 3/46 |
| | | | 136/244 |
| 2014/0218325 A1 | 8/2014 | Iwami | |

(Continued)

FOREIGN PATENT DOCUMENTS

| | | |
|---|---|---|
| JP | S5651367 A | 1/1979 |
| JP | H08153883 A | 6/1996 |

OTHER PUBLICATIONS

International Preliminary Report on Patentability in PCT/US2022/013570, mailed Jul. 23, 2023, 10 pages.

(Continued)

*Primary Examiner* — Jeffrey M Shin

(57) ABSTRACT

A free-space power receiver includes layouts of photovoltaic cells selected to optimize power extraction even when a power beam moves or changes profile on the receiver. The receiver may also include a circuit board, which may include suitable wiring for connecting the photovoltaic cells to one another and to a load for extraction of power. The receiver may include capacitors wired in parallel with the photovoltaic cells.

15 Claims, 37 Drawing Sheets

(56)          References Cited

U.S. PATENT DOCUMENTS

2016/0087132  A1      3/2016  Altenji
2018/0062502  A1*    3/2018  Kim ....................... H02S 40/30

OTHER PUBLICATIONS

Supplementary European Search Report in EP 22743345.5-1002 / 4282008 PCT/US2022013570, mailed May 12, 2024 (18 pages, including machine translations of JPS5451367U and JPH08153883A).
International Preliminary Report on Patentability in PCT/US2023/ 070783, mailed Jan. 28, 2025, 6 pages.

* cited by examiner

900

2100

2100

2100

$C_n^2=6.0\cdot10^{-17}m^{-2/3}$    $C_n^2=6.7\cdot10^{-15}m^{-2/3}$    $C_n^2=1.2\cdot10^{-14}m^{-2/3}$ $C_n^2=1.1\cdot10^{-15}m^{-2/3}$    $C_n^2=1.0\cdot10^{-14}m^{-2/3}$    $C_n^2=1.2\cdot10^{-14}m^{-2/3}$

| A | F | C | H | E | B | G | D |
|---|---|---|---|---|---|---|---|
| B | G | D | A | F | C | H | E |
| C | H | E | B | G | D | A | F |
| D | A | F | C | H | E | B | G |
| E | B | G | D | A | F | C | H |
| F | C | H | E | B | G | D | A |
| G | D | A | F | C | H | E | B |
| H | E | B | G | D | A | F | C |

POWER RECEIVER ELECTRONICS

CROSS-REFERENCE TO RELATED APPLICATIONS

This application is a national phase application under 35 U.S.C. § 371 of PCT Application No. PCT/US23/70783, filed Jul. 21, 2023, which claims benefit under 35 U.S.C. § 119(e) of U.S. Provisional Patent Application No. 63/369, 146, filed Jul. 22, 2022, which also includes subject matter related to International Patent Application No. PCT/US22/ 13570, filed Jan. 24, 2022, which claims priority under 35 U.S.C. § 119 (e) to U.S. Provisional Patent Application Nos. 63/140,256, filed Jan. 22, 2021, and 63/286,516, filed Dec. 6, 2021. All of the above-mentioned applications are incorporated herein by reference to the extent not inconsistent herewith.

BACKGROUND

Power beaming is an emerging method of transmitting power to places where it is difficult or inconvenient to access using wires, by transmitting a beam of electromagnetic energy to a specially designed receiver which converts it to electricity. Power beaming systems may be free-space power (FSP), where a beam is sent through atmosphere, vacuum, liquid, or other non-optically-designed media, or optical fiber power (OFP), where the power is transmitted through an optical fiber. The latter may share certain disadvantages with wires in some circumstances, but may also offer increased transmission efficiency, electrical isolation, safety, and/or reduced mass. FSP may be more flexible, but it may also offer more challenges for accurate targeting of receivers and avoiding hazards such as reflections and objects intruding on the power beam.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventors' approach to the particular problem, which in and of itself may also be inventive.

SUMMARY

In one aspect, a power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor (e.g., having a capacitance of 0.01 F, 0.1 F, 0.5 F, or 1 F) in parallel with at least one PV cell of the plurality. The PV cells of each voltage group are arranged to be not adjacent with one another on the support surface, and the plurality of voltage groups exhibits a current mismatch of less than 5% (e.g., less than 4%, less than 3%, less than 2%, or less than 1%) when the receiver is exposed to a power beam (e.g., a laser power beam), where current mismatch is defined as the difference between the greatest output current and the least output current, divided by the average output current. The power receiver may further include a second capacitor connected in parallel with at least a second PV cell of the plurality of PV cells.

In another aspect, a power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor (e.g., having a capacitance of 0.01 F, 0.1 F, 0.5 F, or 1 F) in parallel with at least one PV cell of the plurality. The PV cells of each voltage group are arranged in a repeating pattern along a first axis of the PV array, the repeating pattern being staggered along a second axis of the PV array by an offset value. The offset value is selected so that PV cells in the same voltage group are not adjacent to one another. The power receiver may further include a second capacitor connected in parallel with at least a second PV cell of the plurality of PV cells.

In another aspect, a power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor (e.g., having a capacitance of 0.01 F, 0.1 F, 0.5 F, or 1 F) in parallel with at least one PV cell of the plurality. Each voltage group has the property that a Voronoi mesh generated from positions of PV cells in the voltage group has a median Voronoi cell aspect ratio of less than 1.4 (e.g., less than 1.3). The power receiver may further include a second capacitor connected in parallel with at least a second PV cell of the plurality of PV cells.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF FIGURES

The drawing figures depicts one or more implementations in according with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
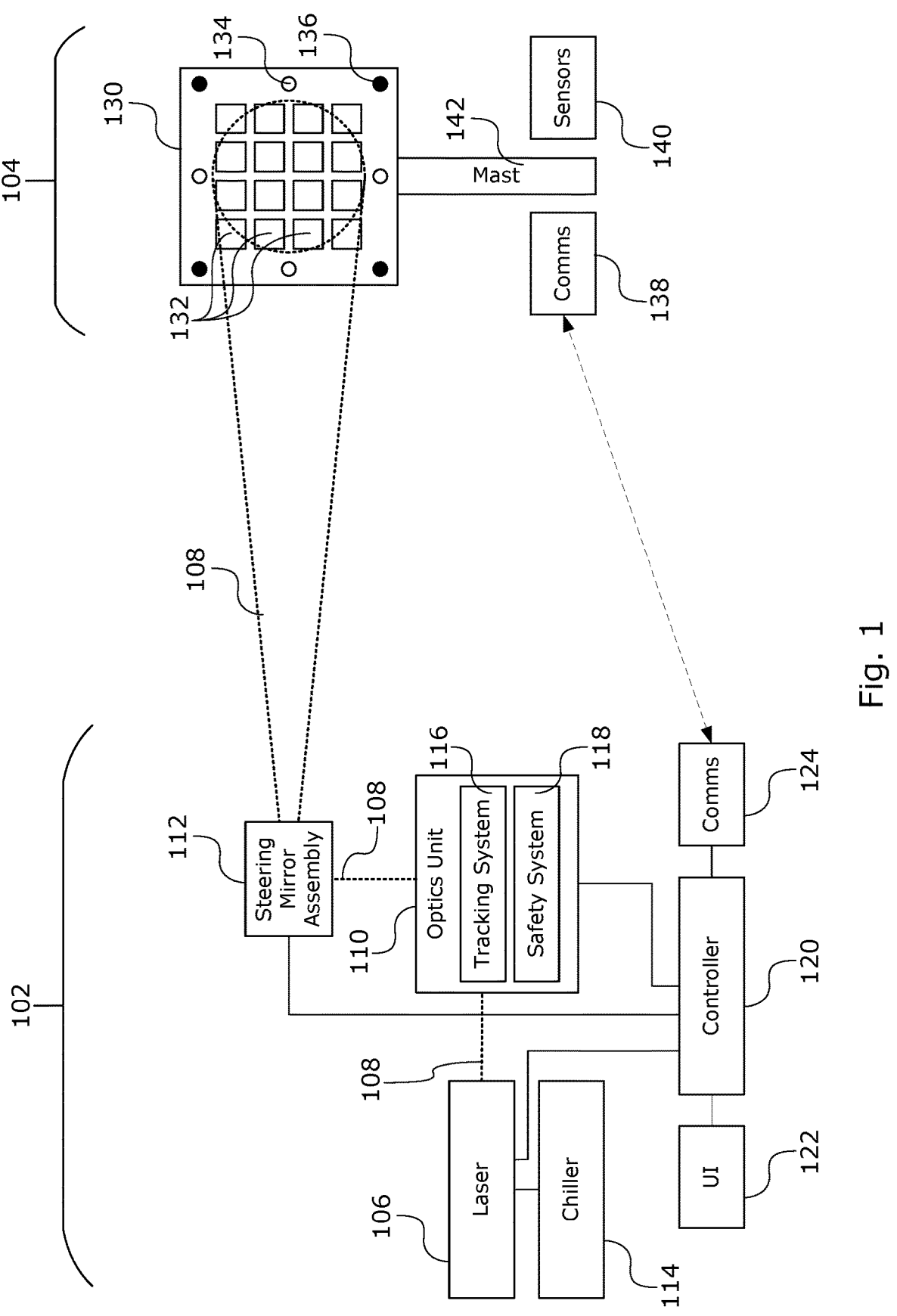
FIG. 1 is a schematic diagram of a power beaming transmitter and receiver.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high level, without detail, in order to avoid unnecessarily obscuring aspects of the present teachings. Those of ordinary skill in the art will nevertheless understand the features of these methods, procedures, components, and/or circuitry and how they may be used in the descriptions below. Other relevant material may be found in other patents and applications as follows:

| U.S. Pat. No. 9,800,091 | Issued Oct. 24, 2017 | Aerial Platform Powered Via an Optical Transmission Element |
| U.S. Pat. No. 10,374,466 | Issued Aug. 6, 2019 | Energy Efficient Vehicle with Integrated Power Beaming |
| U.S. Pat. No. 10,459,114 | Issued Oct. 29, 2019 | Wireless Power Transmitter and Receiver |
| U.S. Pat. No. 10,488,549 | Issued Nov. 26, 2019 | Locating Power Receivers |
| U.S. Pat. No. 10,580,921 | Issued Mar. 3, 2020 | Power-Over-Fiber Safety System |
| U.S. Pat. No. 10,634,813 | Issued Apr. 28, 2020 | Multi-Layered Safety System |

-continued

| U.S. Pat. No. 10,673,375 | Issued Jun. 2, 2020 | Power-Over-Fiber Receiver |
|---|---|---|
| U.S. Pat. No. 10,816,694 | Issued Oct. 27, 2020 | Light Curtain Safety System |
| U.S. Pat. No. 10,825,944 | Issued Nov. 3, 2020 | Device for Converting Electromagnetic Radiation into Electricity, and Related Systems and Methods |
| U.S. Pat. No. 11,105,954 | Issued Aug. 31, 2021 | Diffusion Safety System |
| U.S. Pat. No. 11,368,054 | Issued Jun. 21, 2022 | Remote Power Safety System |
| U.S. Pat. No. 11,581,953 | Issued Feb. 14, 2023 | Dual-Use Power Beaming System |
| U.S. application No. 17/581,667 | Filed Jan. 22, 2022 | Light Curtain System with Enhanced Geometric Configurations |
| U.S. application No. 17/613,015 | Filed Nov. 19, 2021 | Remote Power Beam-Splitting |
| U.S.application No. 17/613,021 | Filed Nov. 19, 2021 | Safe Power Beam Startup |
| U.S. application No. 17/613,028 | Filed Nov. 19, 2021 | Beam Profile Monitor |
| U.S. application No. 17/760,731 | Filed Sep. 16, 2020 | Optical Power for Electronic Switches |
| U.S. application No. 18/054,867 | Filed Nov. 11, 2022 | Beam Homogenization at Receiver |
| U.S. Provisional Application No. 63/281,618 | Filed Nov. 19, 2021 | Beam Reshaping at Receiver |
| U.S. Provisional Application No. 63/286,516 | Filed Dec. 6, 2021 | Perforated Heat Sink |
| International Application No. PCT/US16/33117 | Filed May 18, 2016 | Power Beaming VCSEL Arrangement |
| International Application No. PCT/US22/13570 | Filed Jan. 22, 2021 | Power Receiver Electronics |
| International Application No. PCT/US22/80173 | Filed Nov. 18, 2022 | Dual Contra-Focal Homogenizer |
| International Application No. PCT/US23/65919 | Filed Apr. 18, 2023 | Power Receivers and High Power over Fiber |

Each of these related applications and patents is incorporated by reference herein to the extent not inconsistent herewith.

As discussed above, power beaming is becoming a viable method of powering objects in situations where it is inconvenient or difficult to run wires. For example, free-space power beaming may be used to deliver electric power via a ground-based power transmitter to power a remote sensor, to recharge a battery, or to power an unmanned aerial vehicle (UAV) such as a drone copter, allowing the latter to stay in flight for extended periods of time. Optical fiber power (OFP) systems usually require optical fiber (or an equivalent) to be run from a power source to a receiver, but may nevertheless provide electrical isolation and/or other advantages over traditional copper wires which carry electricity instead of light.

It will be understood that the term "light source" is intended to encompass all forms of electromagnetic radiation that may be used to transmit energy, and not only visible light. For example, a light source (e.g., a diode laser, fiber laser, light-emitting diode, magnetron, or klystron) may emit ultraviolet, visible, infrared, millimeter wave, microwave, radio waves, and/or other electromagnetic waves, any of which may be referred to herein generally as "light." The term "power beam" is used herein interchangeably with "light beam" to mean a high-irradiance transmission, generally directional in nature, which may be coherent or incoherent, of a single wavelength or multiple wavelengths, and pulsed or continuous. A power beam may be FSP, OFP, or may include components of each. For example, a transmitter may transmit a free-space power beam to a receiver surface, which may conduct it as light over an optical fiber to a photovoltaic (PV) cell which converts it to electricity. For the sake of readability, the description may use the term "laser" to describe a light source; nevertheless, other sources such as (but not limited to) light-emitting diodes, magnetrons, or klystrons may also be contemplated unless context dictates otherwise.

For many applications, a power receiver is arranged to receive the FSP or OFP power beam and convert it to electricity, for example using PV cells or other components for converting light to electricity (e.g., a rectenna for converting microwave power or a heat engine for converting heat generated by the light beam to electricity). For the sake of readability, this application may refer to "PV cells" with the understanding that other components having a similar function (such as but not limited to those listed above) may be substituted without departing from the scope of the application.

Power Beaming Systems

FIG. 1 is a schematic diagram of a power beam transmitter 102 and receiver 104. Laser 106 directs a power beam 108 (shown throughout the diagram as a dotted line) toward optics unit 110, which directs the beam to a beam steering assembly, such as mirror assembly 112. Optics unit 110 may include various lenses, mirrors, and other optical elements, as further discussed below. Steering mirror assembly 112 directs power beam 108 to power receiver 104. Optional chiller 114 is shown as connected to laser 106, but other components of transmitter 102 may also have independent or connected thermal management systems as required. Also shown in FIG. 1 as part of transmitter 102 are tracking system 116 and safety system 118. These systems are shown as being internal to optics unit 110 in the figure, but those of ordinary skill in the art will recognize that in some implementations, they may be external to optics unit 110, part of steering mirror assembly 112, or elsewhere in the transmitter system. Also shown are TX controller 120, user interface 122 and TX communication unit 124, all of which are further discussed below in connection with FIG. 2. It will be understood that transmitter 102 may include other elements, such as beam shapers, guard beams, or other appropriate accessory elements, that have been omitted from FIG. 1 for the sake of simplicity of the illustration. Some of these elements are shown schematically below in FIG. 2, but those of ordinary skill in the art will understand how to combine optical and control elements in a power transmitter.

Receiver 104 in FIG. 1 includes a PV array 130, which includes a plurality of individual PV cells 132 (not all PV cells are labeled in order to avoid unnecessarily cluttering the figure). PV cells 132 convert incoming power beam 108 into electricity as further described below. Receiver 104 also shows optional tracking emitters 134, which in some implementations may be used by the tracking system 116 to monitor the position of PV array 130 for beam tracking or for other purposes. Receiver 104 also shows optional safety emitters 136, which in some implementations may be used by safety system 118 to monitor power beam 108 for potential intrusions, reflections, or other safety hazards. RX communication unit 138 is in communication with TX communication unit 124 (as indicated by the dashed line), and may be used for safety, tracking, telemetry, feedback control, or any other purpose for which it may be desirable for transmitter 102 and receiver 104 to communicate. While the illustrated embodiment provides communication across a separate channel such as a radio link between transmitter 102 and receiver 104, it is also contemplated that communication may be accomplished via modulation of power beam 108, tracking emitters 134, safety emitters 136, or other existing components of the power beaming system. Receiver 104 may also include optional RX sensors 140, further described below in connection with FIG. 3. As shown in FIG. 1. PV array 130 is mounted on optional mast 142, which may elevate receiver 104 to allow power beam 108 to avoid humans or other obstacles.

Figure 2:
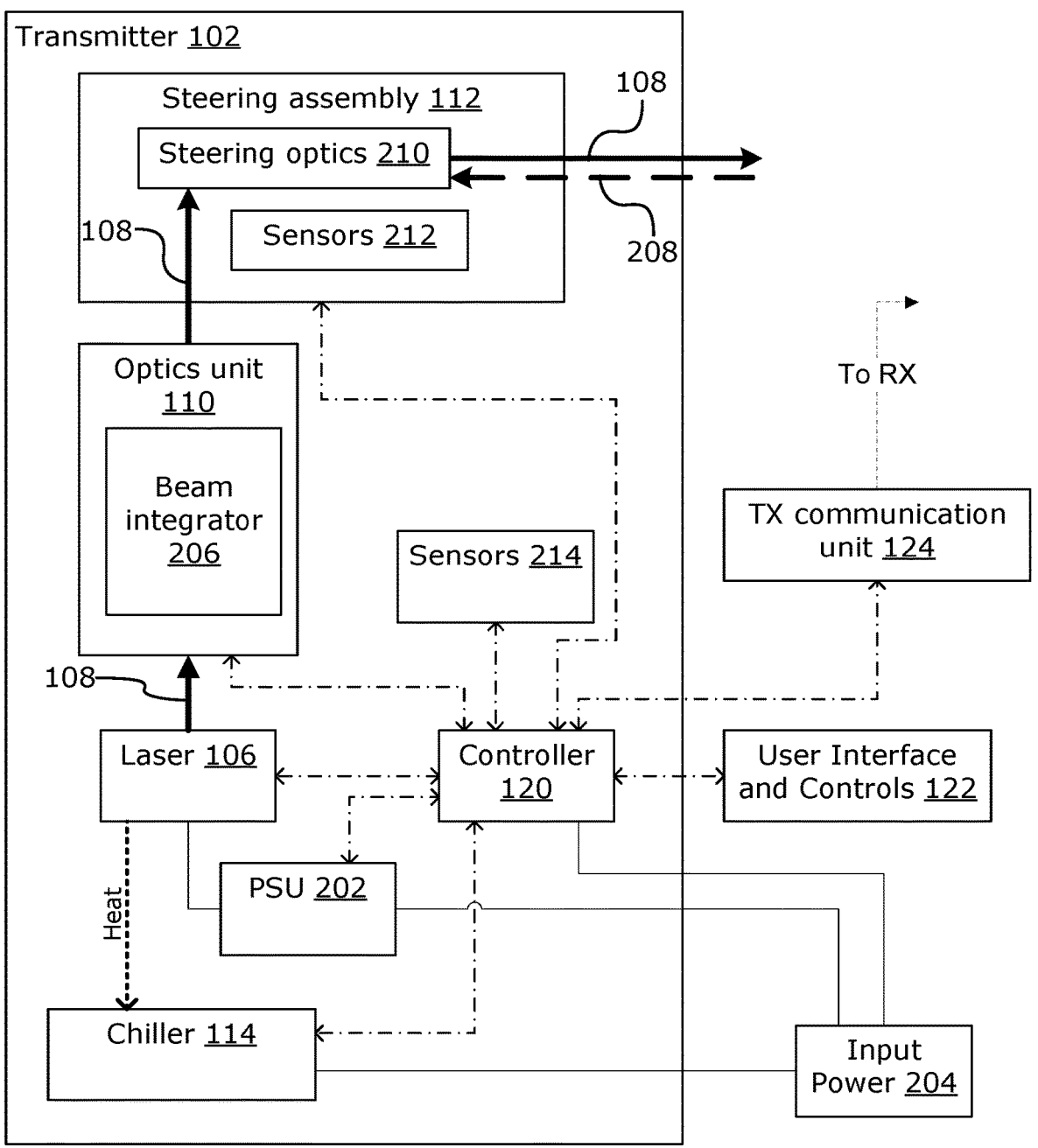
FIG. 2 is an abstracted diagram of the power beaming transmitter of FIG. 1, showing interrelationships between components of the transmitter.

FIG. 2 is an abstracted diagram showing functional relationships between components of the transmitter. Transmitter 102 includes a laser 106, but it will be understood that other light-generating components, such as an LED or a magnetron, may be substituted for laser 106 in some implementations. Laser 106 is connected to controller 120, power supply unit (PSU) 202 (which is in turn connected to input power 204), and a thermal management system (chiller) 114. Throughout FIG. 2 and FIG. 3, heat flow is denoted by heavy dotted lines, while power beam 108 is denoted by a heavy solid line, sensor signals are denoted by heavy dashed lines, data and/or control signals are denoted by dot-dashed lines, and electrical power is indicated by a thin solid line. For the sake of clarity, not all internal electrical connections are shown.

Controller 120 controls operation of laser 106 and may be manual (for example using a user interface 122), partially automated, or fully automated, depending on design constraints of the system. In particular, controller 120 may receive input from a safety system, for example as described in commonly owned U.S. Pat. Nos. 10,634,813; 10,816,694; 11,105,954; and 11,368,054 and U.S. patents application Ser. Nos. 17/613,021 and 17/581,667. The safety system may be designed to turn down or to turn off the beam, for example when an uninterrupted optical path from transmitter 102 to receiver 104 cannot be assured or when other hazardous conditions may be associated with continuing to beam power. Controller 120 may receive input (data) from other components, for example to monitor the health or temperature of the laser. PSU 202 draws power from input power 204, which may be, for example, a power grid, a generator, or a battery, and supplies it to laser 106. In the figure, controller 120 and chiller 114 are directly connected to input power 204, but in other embodiments, these or other components may receive power from power supply unit 202.

Chiller 114 monitors the temperature of laser 106 (and/or other components of the transmitter as necessary) and makes sure it does not exceed safe values.

As shown in FIG. 2, power beam 108 emerges from light source 106 and enters optics unit 110. It will be understood that while light 108 maintains the same reference numeral throughout FIG. 2, the characteristics of light 108 may change in various ways (e.g., polarization, convergence/divergence angle, beam profile, or intensity) as it passes through different optics and other components. Optics unit 110 may include beam integrator 206 and other optics such as lenses, mirrors, phased arrays, or any other appropriate component for managing direction, divergence, and beam irradiance profile of the light, or for merging different optical power beams and/or signals. Beam integrator 206 will generally be chosen to match the wavelength domain of light source 106, and can be used to change the size, shape, or intensity distribution of the power beam. For example, when beaming power to a receiver, it may be desirable in some implementations to match the beam width to the size of the receiver, and possibly to "flatten" the beam irradiance profile to be relatively uniform across a surface of the receiver, for example converting a substantially Gaussian beam profile to a "top hat" or super-Gaussian profile. Beam direction and beam profile shaping is discussed in more detail in co-pending and commonly owned U.S. patent application Ser. No. 17/613,028. In particular, the mechanisms described therein for monitoring the placement of a power beam on a receiver and using the monitored data to feed back to controller 120 and/or to steering assembly 112 may be incorporated into the present system.

Steering assembly 112 may include steering optics 210 and/or sensors 212, which may be used in some implementations to provide feedback information for tracking the receiver and pointing the beam at it, to measure the beam characteristics such as direction or irradiance profile, or to monitor for potential intrusions into the light path. Steering assembly 112 may also include merging optics. Merging optics are generally used for combining multiple optical paths, or possibly for separating them when optical flow is in the opposite direction. For example, an outgoing power beam 108 for transmitting power may be combined with an incoming optical beacon 208 used for tracking a receiver, as shown in the figure. As illustrated, the beacon is used at steering assembly 112 for tracking, but in other implementations, signal 208 may propagate to optics unit 110 or beyond.

Transmitter 102 may also be provided with sensors 214, which may be used to monitor ambient conditions. Sensors 212, 214 may be used to adjust beam integrator 206 and/or steering optics 210. For example, sensors 212 might monitor position of a focusing lens or other optical component in steering assembly 112, while sensors 214 might be used to monitor ambient and/or other component temperatures. Data from sensors 212, 214 may be fed back into controller 120 to adjust laser 106, for example for safety considerations, or to control steering optics 210 and/or steering assembly 112 to direct beam 108 onto the receiver. Control and data signals may pass between controller 120 and other components, as shown by dot-dashed lines in FIG. 2, and controller 120 may control communication with the receiver, for example using transmitter communication unit 124.

After passing through optics unit 110, power beam 108 is directed by steering assembly 112 in a desired direction away from transmitter 102. In some implementations, steering assembly 112 may include steering optics 210, motors for adjusting mirrors or other components (not shown), and/or more shaping optics (not shown). Those of ordinary skill in the art will understand that different implementations may require different arrangements of optical elements (such as the order of components that the light passes through) without changing the fundamental nature of the transmitter system.

Figure 3:
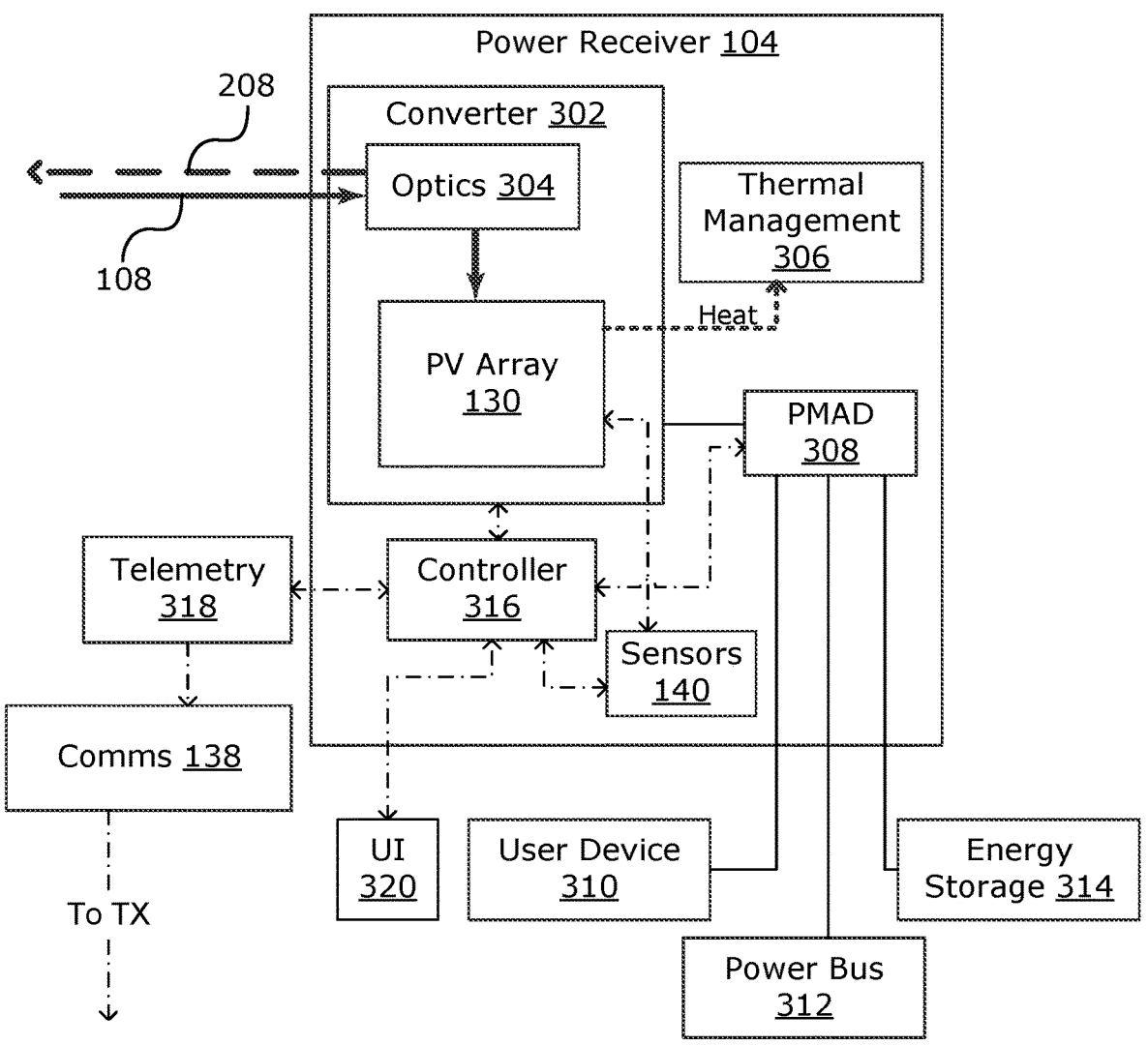
FIG. 3 is an abstracted diagram of the power receiver of FIG. 1, showing interrelationships between components of the receiver.

FIG. 3 shows functional relationships between components of a power receiver 104, such as the receiver shown in FIG. 1. Illustrated receiver 104 includes power converter 302, which includes PV array 130 of PV cells 132. Power converter 302 is configured to convert power beam 108 from laser 106 into electricity (or, in some implementations, into another useful form of energy). Receiver 104 may also include optics 304, which may shape or modify the received beam before it reaches PV array 130, for example as described in U.S. patent application Ser. No. 17/613,015. In many implementations, PV array 130 includes a thermal management system 306. This system may include passive or active cooling, and it may be configured to send a signal back to transmitter 102 if any part of PV array 130 exceeds safe temperature limits (for example, via RX communication unit 138).

Power converter 302 may further be connected to power management and distribution (PMAD) system 308. PMAD system 308 may power user devices 310, a power bus 312, and/or energy storage devices 314. PMAD system 308 may be connected to controller 316, which may monitor PV array 130 via sensors 140, for example monitoring voltage, current, and/or temperature of individual photovoltaic cells, groups of cells, or of the whole array, voltage and/or current of the PMAD or of individual loads. Controller 316 may also include Maximum Power Point Tracking (MPPT) for PV array 130, or MPPT may be handled by PMAD system 308. PMAD system 308 may also include DC/DC converters, for example to provide power to devices 310, 312, 314 with preferred voltage and current characteristics. Telemetry unit 318 may send any or all of the above data back to the transmitter for use in controlling light beam 108, for example through RX communications unit 138. In some implementations, controller 316 may communicate with a receiver user interface 320, which may allow local viewing and/or control of receiver operations by a user of the power receiver.

Also visible in FIG. 3 is a signal 208 (e.g., an optical signal) being sent back to transmitter 102 by receiver 104, which may be sent along the same path as power beam 108 as shown. In some implementations, for example, signal 208 may include a safety signal that is used to assure an uninterrupted path from transmitter 102 to receiver 104. In some implementations, this signal may be sent from safety emitters 136. More details on safety systems may be found, for example, in commonly owned U.S. Pat. Nos. 10,580, 921; 10,634.813; 10,816,694; 11,105,954; and 11,368,054, and U.S. patent application Ser. No. 17/613,021. In some implementations, signal 208 may include a tracking signal that is used to position power beam 108 on power converter 302, such as a signal sent from tracking emitters 134. While signal 208 as shown in the figure is an "active" signal, in other implementations, emitters 134, 136 may be replaced by fiducial marks (not shown) that are identified by transmitter 102 or by other appropriate components in the power transmission system.

Any receiver components that require power, for example but not limited to thermal management system 306, RX communication unit 138, PMAD system 308, controller 316, telemetry unit 318, and/or user interface 320, may be powered by power converter 302 (directly or via PMAD

308) if desired. If components are powered by converter 302, the system might include a battery (either as part of energy storage 314 or as a separate component) to power these components during start-up or at other times when converter 302 is not supplying power. In some implementations, receiver 104 may be configured for a "cold" start-up without use of a local battery.

Distributed Wiring Arrangements

Figure 4:
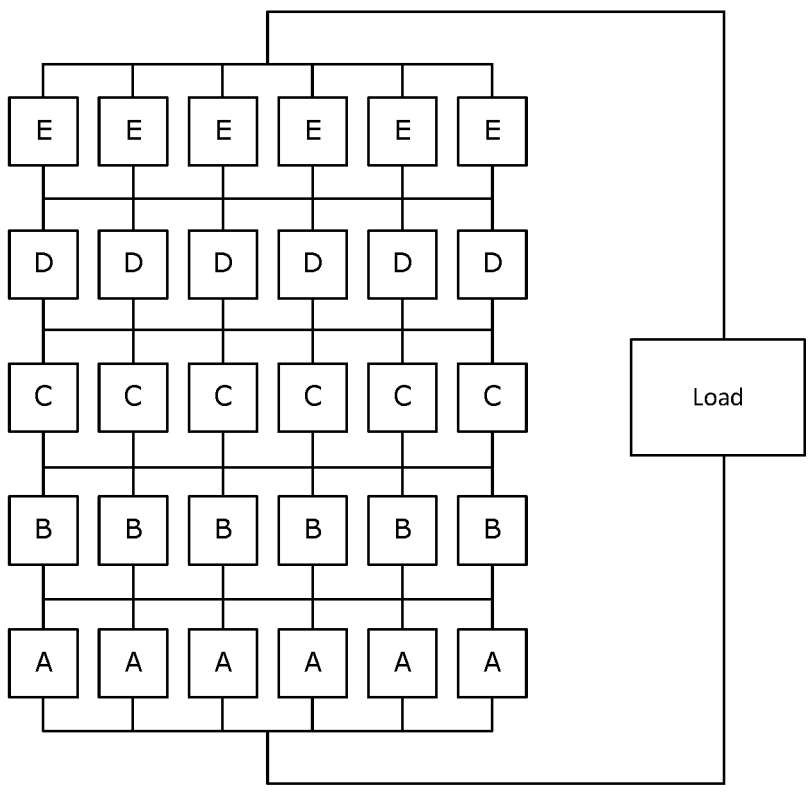
FIG. 4 is a wiring scheme for a PV array.

Because each PV cell in a PV array generates a relatively small voltage compared to typical loads, PV arrays are typically wired to place some PV cells in series with one another, adding their voltages to a more usable output voltage. In some arrays, "strings" of PV cells are wired in series, and then the strings are wired in parallel, thereby adding the string output currents. In other arrays, PV cells are wired in parallel, and then the parallel strings are wired in series as further described below, as illustrated in FIG. 4. As explained by Kare in U.S. provisional patent application No. 60/999,817, entitled "Photovoltaic Array" (hereinafter. "Kare"), the former type of array performs efficiently if all PV cells within a series-wired string produce equal current. If one PV cell in a string produces no output due to damage or shadowing, it may be bypassed by a bypass diode, reducing the current for that string but losing only slightly more total output power from the array than that one PV cell produced. However, if the PV cells are illuminated with varying amounts of light, the current in the series string will be limited by the least-illuminated PV cell that is not reverse-biased. We note that this is not generally a problem for a solar array, which will typically be evenly illuminated, but when a PV array is illuminated by a laser beam which may be spatially nonuniform or may move relative to the array, this effect may limit the efficiency of power production.

Kare described a system of physically distributing parallel-wired PV cells across an array surface. It is noted that the arrays shown herein, both those drawn from Kare and the innovative arrays we describe below, have the electrical wiring schematic shown in FIG. 4, but the physical positions of the PV cells of each array differ from layout to layout. Kare disclosed a randomly arranged array, where PV cells at each of four voltage levels are spread across the array surface, and also a "staggered" array, where PV cells are divided into strings and groups that may be split across columns. The random array is shown for reference in FIG. 5(*a*), and the staggered array is shown in FIG. 5(*b*). (FIG. 5(*a*) and FIG. 5(*b*) may be referred to collectively herein as FIG. 5.) In these figures, the shape codes of Kare have been replaced with letters representing the voltage levels for each PV cell. With respect to FIG. 5(*b*), Kare described in his FIG. 5 a 4×9 array of rectangular PV cells, which is shown as "doubled" in FIG. 5(*b*) to form an 8×9 array of square PV cells instead. Kare describes repetition of arrays in this fashion in the paragraph spanning pages 3-4. The arrays illustrated in Kare use rectangular PV cells with a significant spacing between them, while most of the new arrays described herein are illustrated with square PV cells with little or no space between them. Arrays of the latter type may use concentrators designed to capture substantially all incident light, or may simply be placed very close together, so that "lost" light falling between the PV cells is minimal.

The arrays of FIG. 5 will be compared with new arrays in the following discussion, as will pre-Kare arrays of parallel-wired strings of PV cells, with the PV cells wired in series within each string. Kare did not describe how to generalize its arrays to larger sizes (other than by repetition as mentioned above), nor did it describe any rules for creating additional PV array layouts beyond two examples. We provide below principles for creating new PV array layouts with superior performance.

There are a number of external factors that affect the number of voltage levels for a PV array design using parallel wiring for groups of PV cells. In particular, there may be a desired total output voltage for a design load, or limits on the minimum or maximum voltage that the load can handle. The nominal output voltage of a PV cell divided into that desired output voltage will usually guide the number of voltage levels, but other factors to consider include the desired size of the PV array, the desired number of PV cells in the array, the ways in which a specific number of voltage levels may be evenly divided between that quantity of PV cells, and the provision of optional DC voltage converters, regulators, and capacitors (further discussed below). The arrays of Kare were shown with four voltage levels, but we have found in at least some cases that five or six levels may allow us to avoid having to install voltage converters, thereby saving space and weight for PV arrays. In some implementations, power receivers may be incorporated into mobile components that can drive or fly from one place to another, so weight may be a very important consideration in receiver design for such implementations. Even more voltage levels may be preferable in certain implementations: we have envisioned an array having as many as 75 voltage levels with four to ten PV cells (or more) per level. However, we expect that for most uses, six to 30 voltage levels will be sufficient, and as few as four to six may be suitable in many cases.

Figure 6:
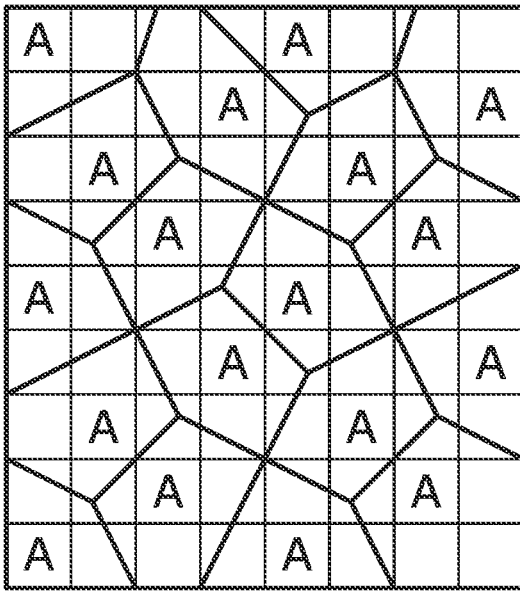
FIG. 6 shows a Voronoi mesh for one voltage level for the array of FIG. 5(b), and a histogram of aspect ratios of the illustrated mesh.
Figure 6:
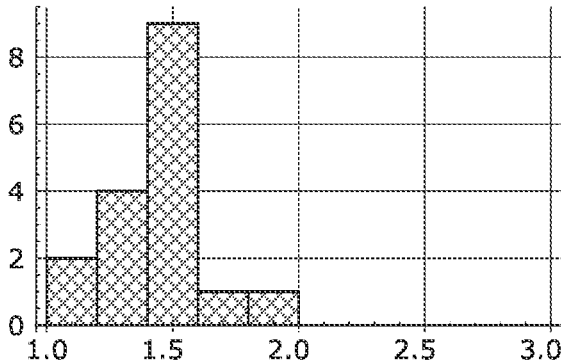
Figure 7:
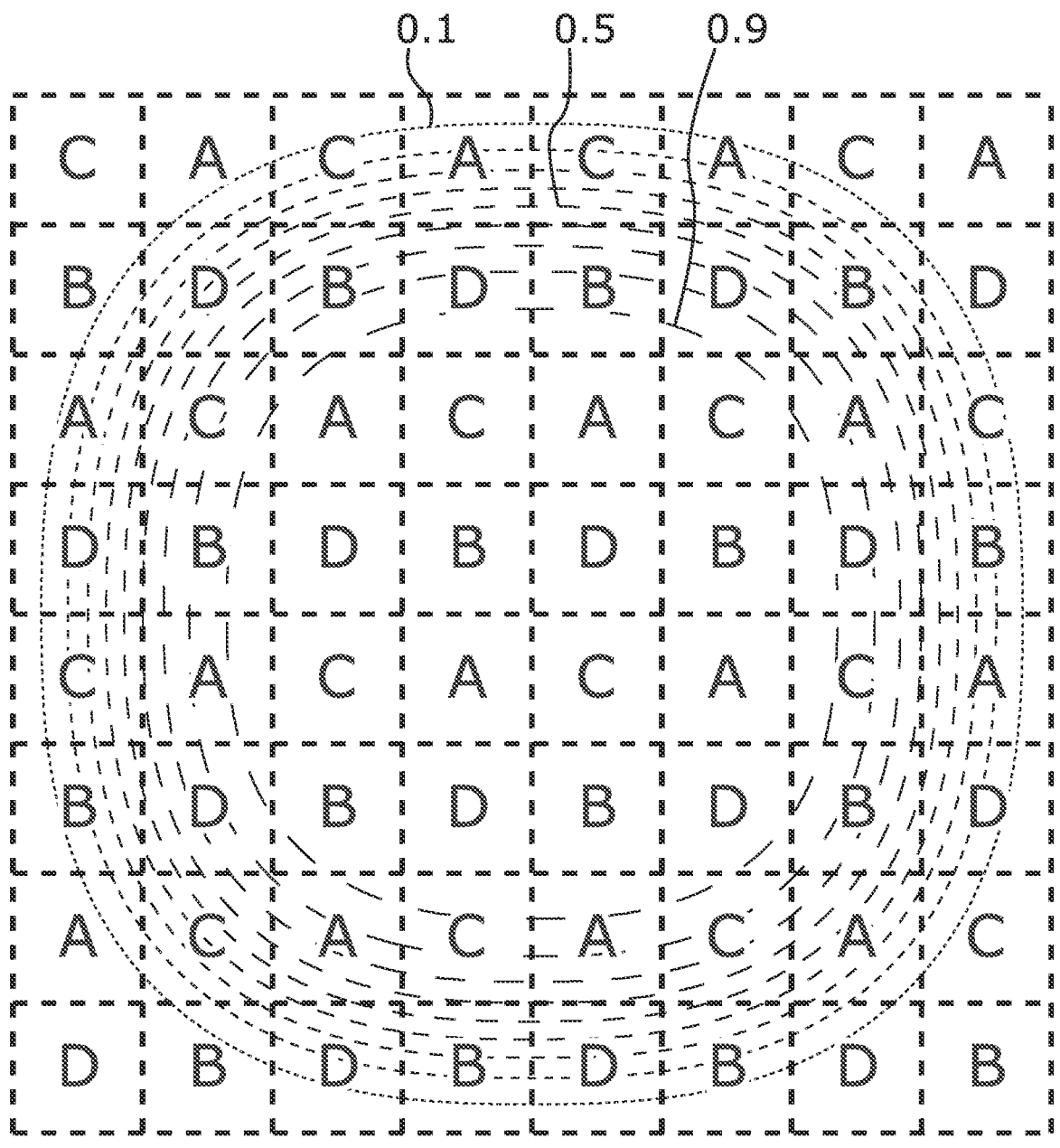
FIG. 7 shows a PV array of approximately the same size and shape as FIG. 5(b) with a model beam profile.
Figure 8:
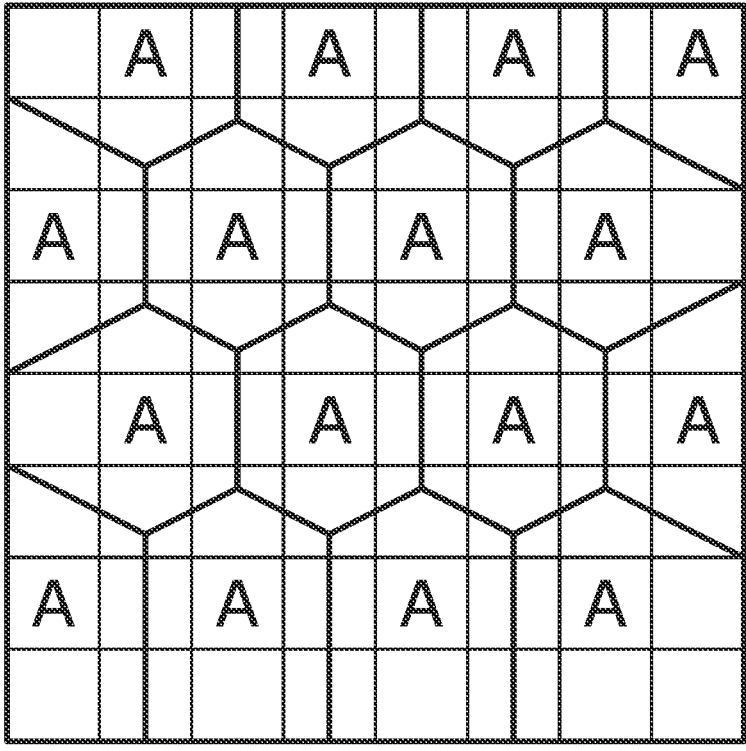
FIG. 8 shows a Voronoi mesh for one voltage level for the array of FIG. 7, and a histogram of aspect ratios of the illustrated mesh.
Figure 8:
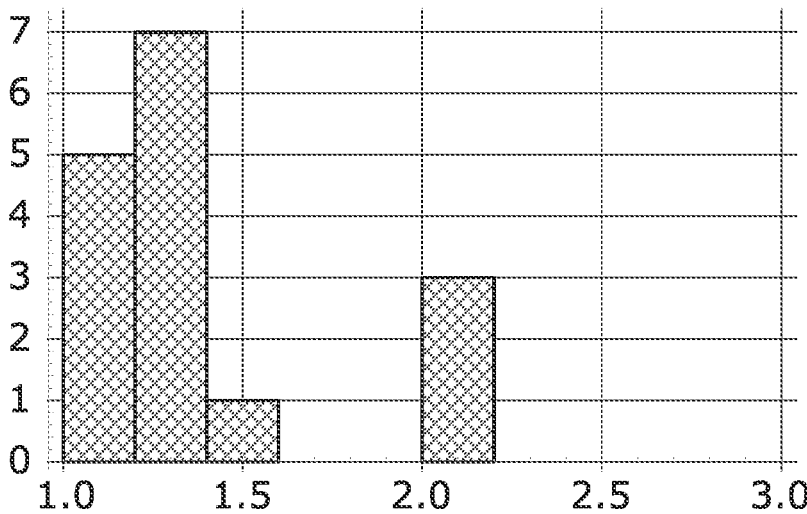
Figure 18:
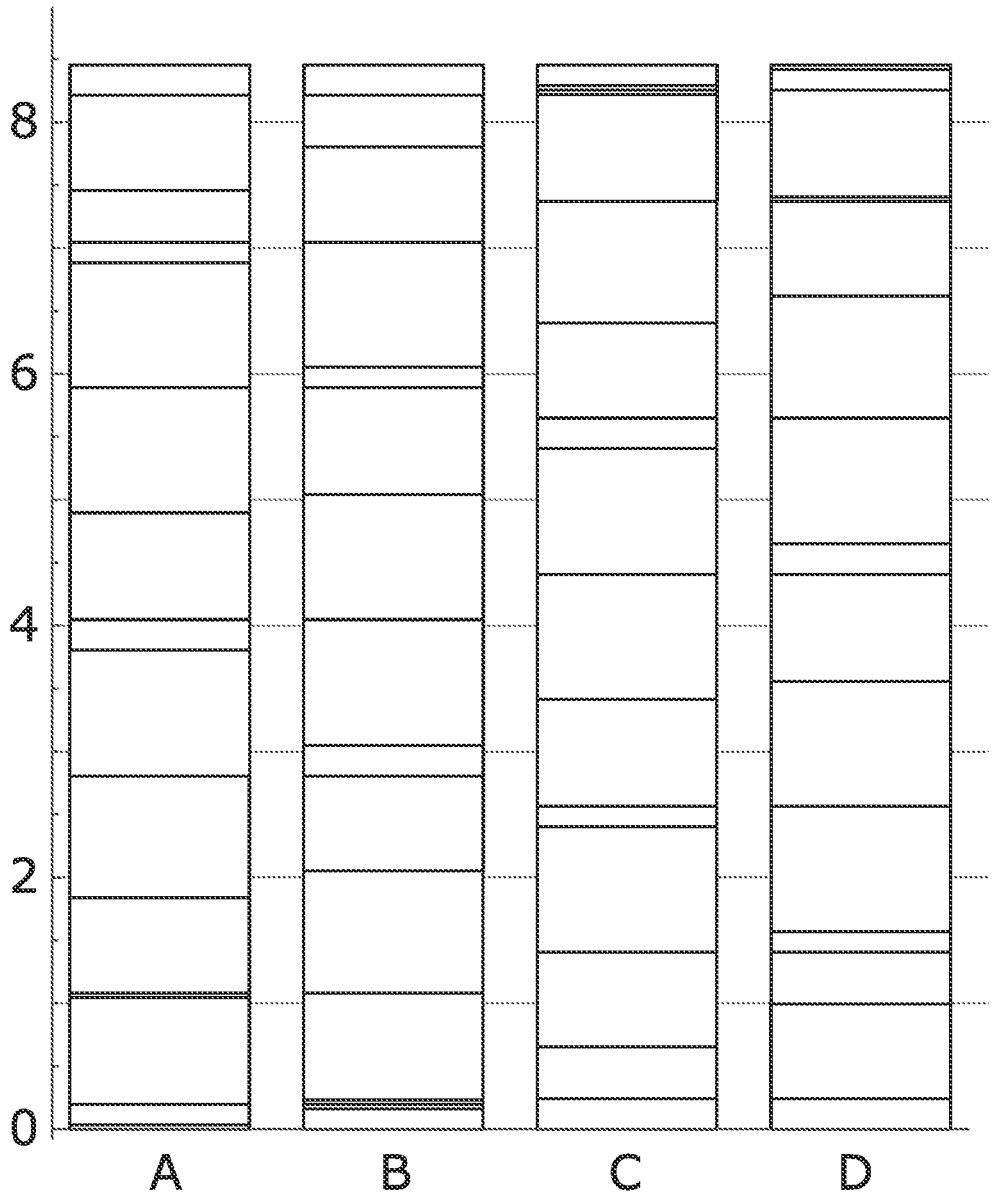
FIG. 18 shows modeled level currents for the array shown in FIG. 7.

Generally speaking, we have found that the arrays that perform best when exposed to beam wander and beam intensity profile variation have the PV cells for any one level "evenly" distributed in space across the PV array. A metric we have used to determine the evenness of this distribution is to use the centers of PV cells at each voltage level to generate a Voronoi mesh, and then to look at the aspect ratios of the Voronoi cells in the mesh. We have found that the best-performing arrays have Voronoi cell aspect ratios as close as practical to 1.0, preferably having a median aspect ratio of less than 1.5, more preferably less than 1.3, or even more preferably less than about 1.1. FIG. 6 shows Voronoi meshes for one voltage level of the Kare array shown in FIG. 5(b), and also shows a histogram of the pictured Voronoi cell aspect ratios; the histogram shows Voronoi cell aspect ratios ranging from 1.3 to 2.2, with the median-shaped Voronoi cell having an aspect ratio of 1.5. For comparison, a mesh for a new array that will be discussed below in connection with FIG. 18 is shown in FIG. 7; its accompanying histogram in FIG. 8 shows Voronoi cell aspect ratios ranging from 1.0 to 2.6, with the median-shaped Voronoi cell having an aspect ratio of 1.31. We note that the Voronoi cells having the highest aspect ratios often appear at the array edges.

Figure 9:
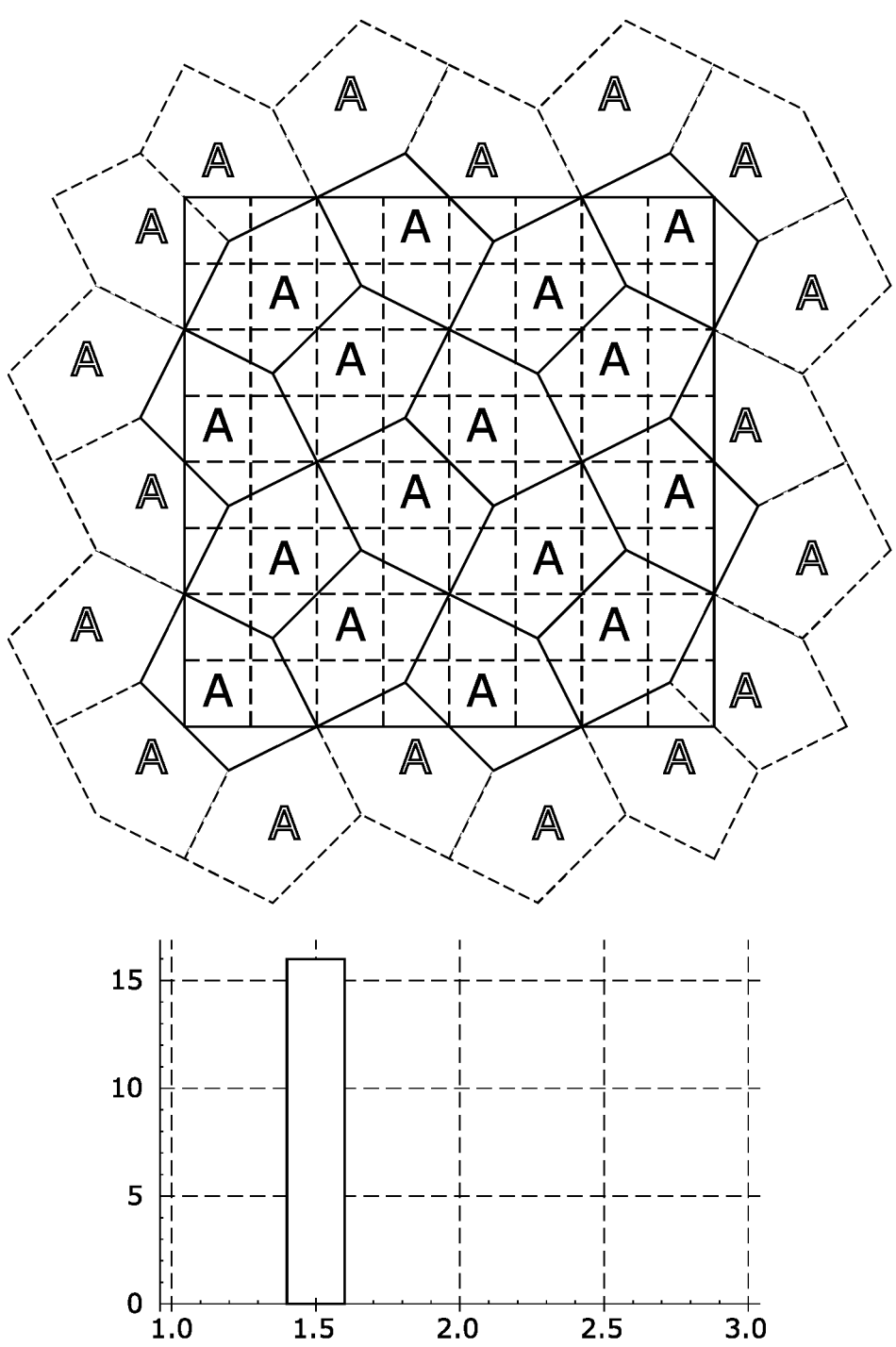
FIG. 9 shows a Voronoi mesh corresponding to the mesh shown in FIG. 6, but with an expanded number of cells.
Figure 10:
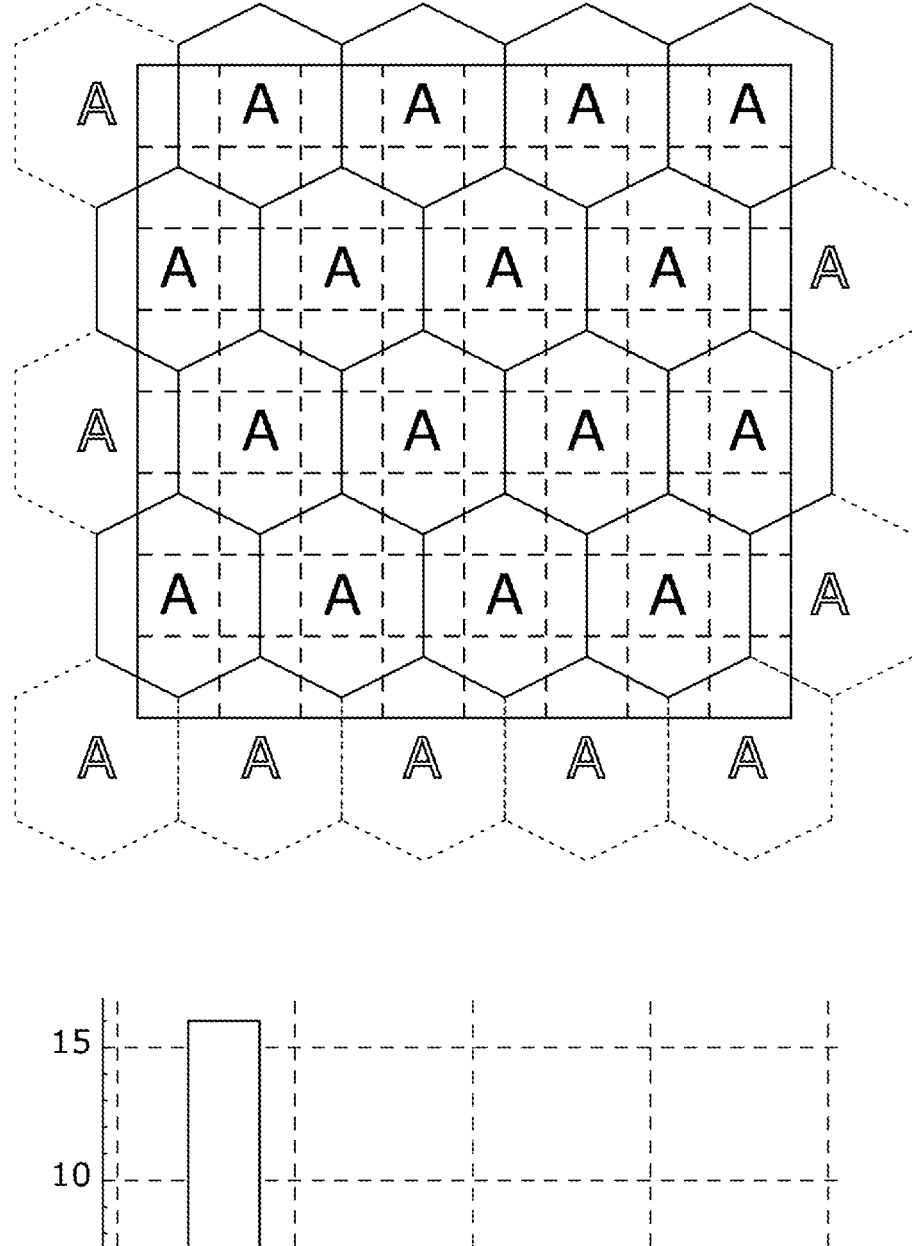
FIG. 10 shows a Voronoi mesh corresponding to the mesh shown in FIG. 8, but with an expanded number of cells.

In some implementations of our array design process, we may "extend" a pattern of voltage levels beyond the edges of the physical array for purposes of making the Voronoi cell calculation. For example, instead of an 8×8 array as shown in FIG. 5(b), we determine Voronoi cells for a 12×12 array using them same regular pattern, and then determine the aspect ratio only of the cells corresponding to the members of the center 8×8 array, yielding the revised Voronoi diagram and corresponding aspect ratio histogram shown in FIG. 9. A similar extension of the array shown in FIG. 7 leads to the Voronoi diagram and corresponding aspect ratio histogram shown in FIG. 10. This extension may avoid artifacts at the edges of the array where cells appear to have larger aspect ratios; in each of FIG. 9 and FIG. 10, all of the Voronoi cells have the same aspect ratio. Even with these expanded diagrams, however, the array illustrated in FIG. 10 has cells with a lower aspect ratio than those shown in FIG. 9.

Figure 11:
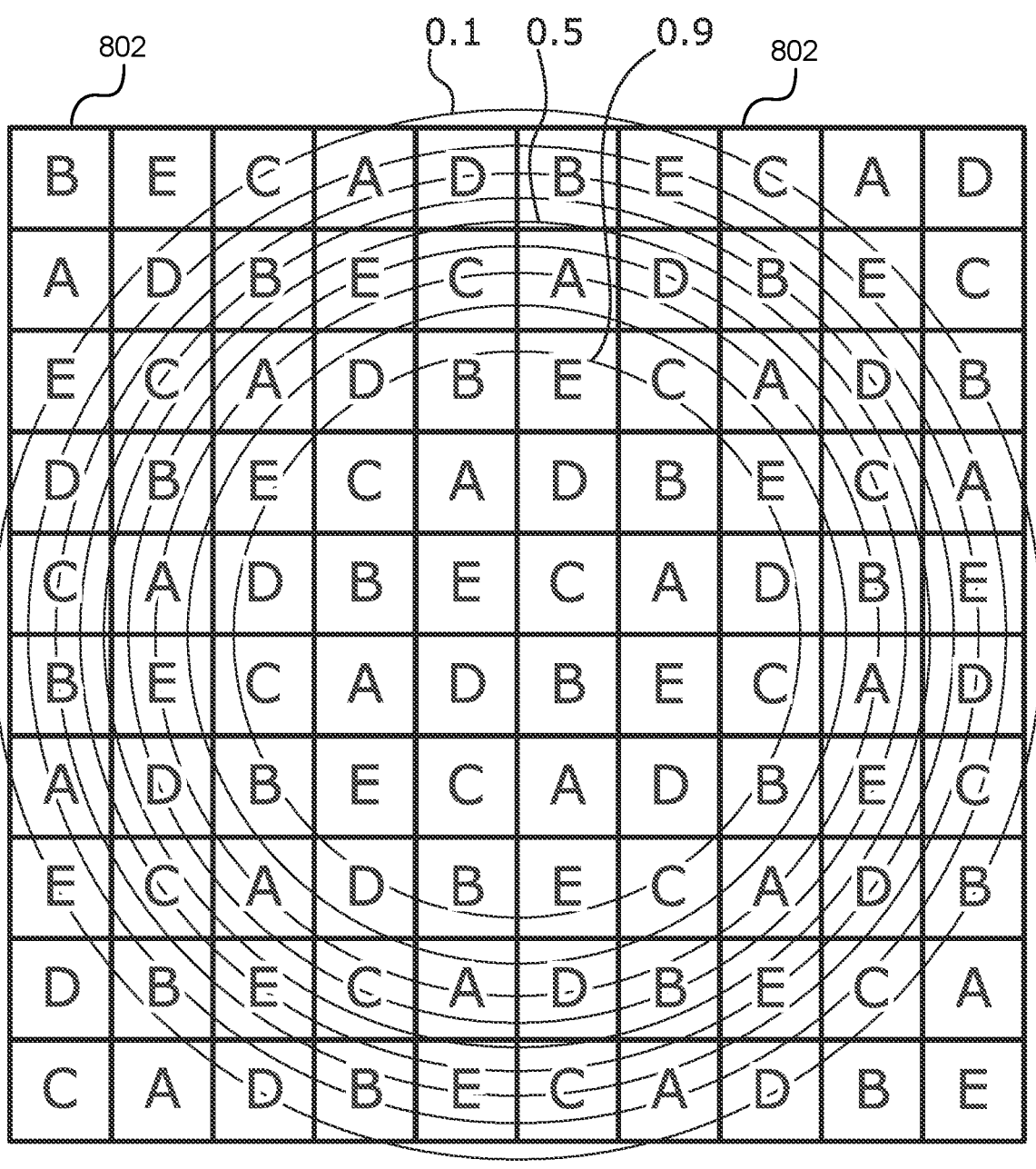
FIG. 11 shows a square PV array layout showing voltage levels for each cell, with a beam profile superimposed.
Figure 12:
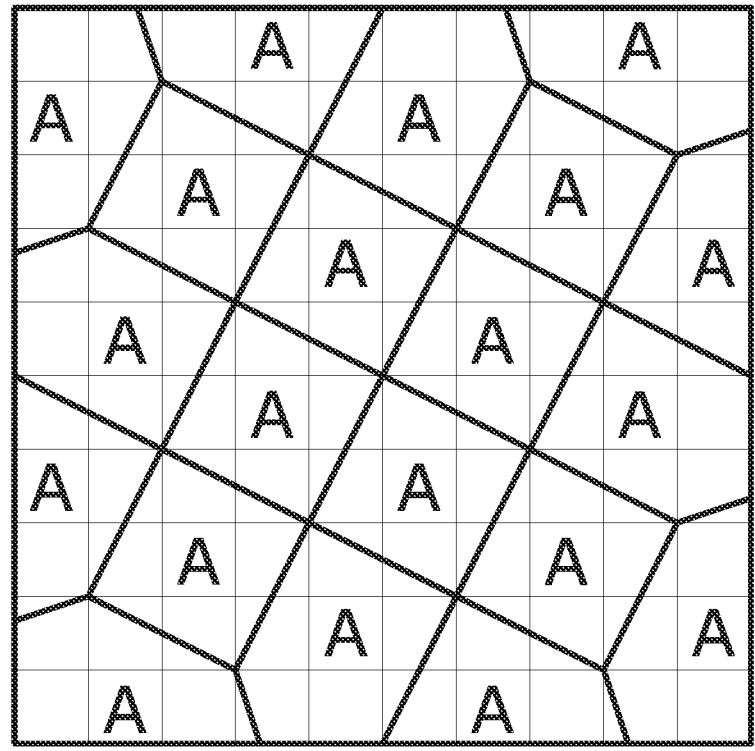
FIG. 12 shows a Voronoi mesh for cells at one voltage level for the array of FIG. 11, and a histogram of aspect ratios of the illustrated mesh.
Figure 12:
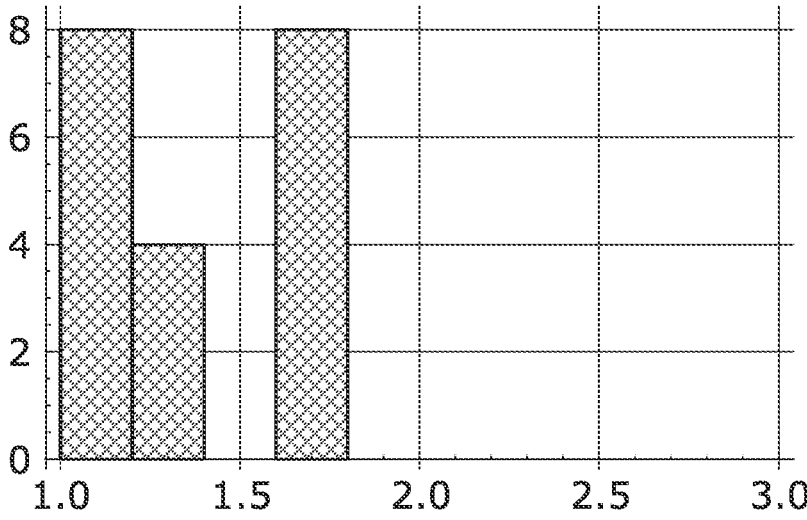

To achieve array layouts with evenly spread PV cells at each voltage level, one method we have used is to create "staggered" arrays, which repeat a pattern of PV cell voltage levels in each column, with an offset for each so that the same PV cells will not be adjacent to one another horizontally or vertically. (While the Kare array shown in FIG. 5(b) has been described therein as "staggered," it does not have a constant offset from column to column. As used in the present application, a "staggered" array means one with a constant offset from column to column unless context clearly dictates otherwise.) As used herein, the term "adjacent" means having an adjacent edge, and "diagonally adjacent" means having an adjacent corner, like the two A-level cells in FIG. 5(a) at the top left of the figure. If two PV cells are described as "not adjacent," they may still be diagonally adjacent unless further restrictions are added. One staggered array 800 is shown in FIG. 11. PV cells 802 are arranged in a 10×10 array and are labeled to show which of five voltage levels that they belong to. As shown, the PV cells in successive columns are staggered with an offset of 2: that is, the horizontally-adjacent PV cells will be at level −2 to the right of a column and +2 to the left (modulo 5); this produces an array arrangement in which no two PV cells 802 are either adjacent or diagonally adjacent. Contour lines shown on FIG. 11 will be discussed below in connection with FIG. 19 and FIG. 20. FIG. 12 shows the Voronoi cells for current level A of FIG. 11, and a histogram of aspect ratios of Voronoi cells in FIG. 12 is also shown. The median aspect ratio for Voronoi cells in this array is 1.33 (also shown below in Table 1). Those of ordinary skill in the art will appreciate that many possible combinations of the size of the array, the number of voltage levels, and the offset may be chosen. In order to produce Voronoi cells having a low aspect ratio, it is believed that the offset should be greater than one and at least two less than the number of voltage levels. It is also believed that the offset and the number of voltage levels should have a greatest common divisor (GCD) of one, but some layouts with a greater GCD may also produce Voronoi cells having an adequately low aspect ratio.

Figure 13:
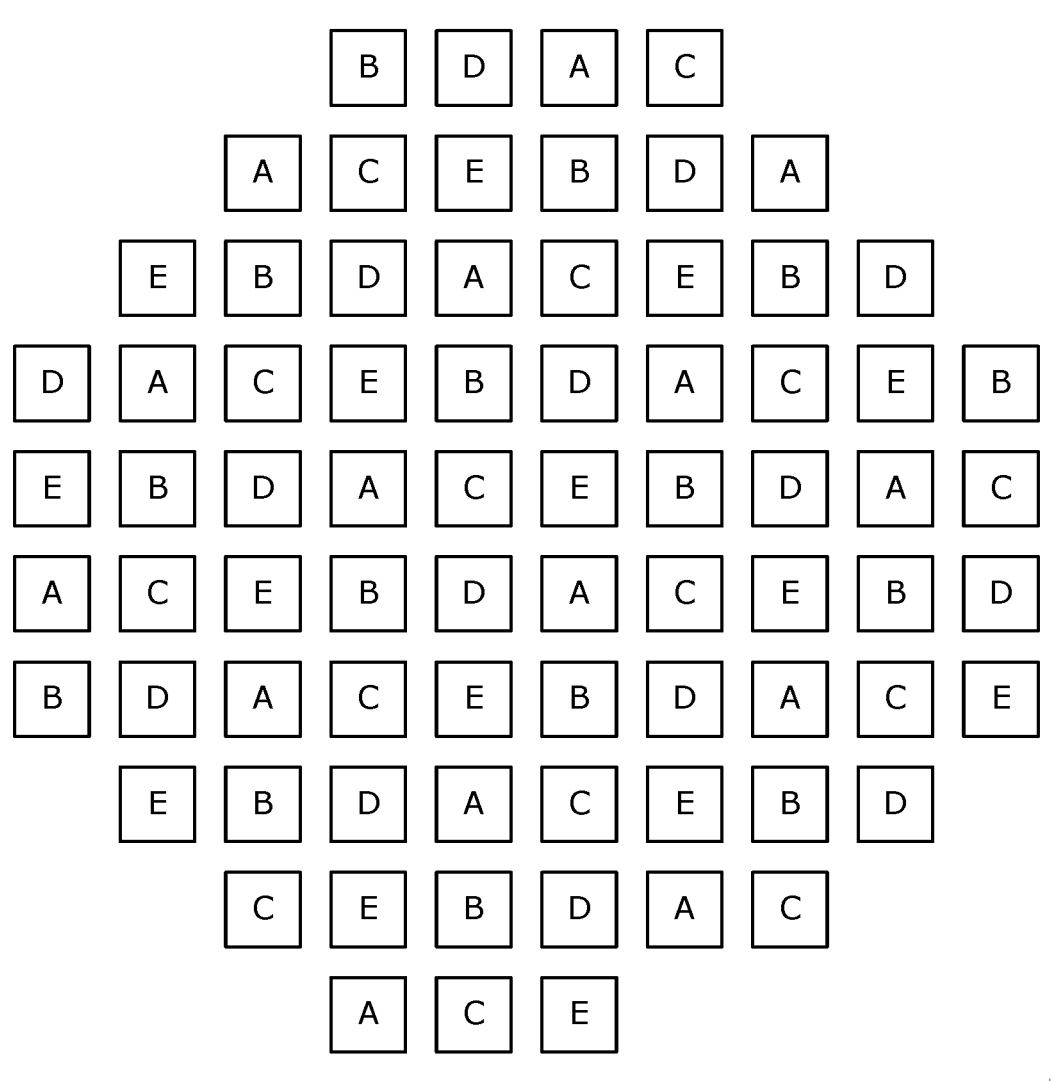
FIG. 13 shows a PV array layout having a roughly octagonal shape.

Another array 900 is shown in FIG. 13. This array is also based on a 10×10 array like the one in FIG. 11, but the corner PV cells have been removed from the array. This shape has been found advantageous for use with a beam having approximate circular symmetry. It will be noted that symmetric removal of the corners may change the number of PV cells in each voltage group so that they are no longer equal. While it may be possible or even advantageous to construct a PV array with different numbers of PV cells in each voltage level in some implementations, generally it has been found to be advantageous to maintain the same number of PV cells in each level if possible. A "perfect" arrangement of a 10×10 array of PV cells with six PV cells removed at each corner would leave 76 PV cells, which cannot be divided evenly into five voltage levels. For this reason, one PV cell that would otherwise be in level B has been omitted at one edge of the array, visible at lower right in FIG. 13. PV cells at the array edges are generally expected to contribute less to total power transmitted because beams often (but not always) have a higher intensity at the center than at the edge.

The array shown in FIG. 13 has been modeled theoretically as discussed below, but it also has been physically constructed and used for FSP power beaming. The physical array includes a "waffle board" (further described in International Patent Application No. PCT/US22/13570) that is a multilayered circuit board, where connections for PV cells of different voltage levels are separated into different layers of the circuit board. Individual PV cells are connected only to a carrier, which also includes a thermistor for monitoring PV cell temperature, and not directly to other PV cells. All connections between PV cells (as well as the temperature monitoring signal from the thermistor, not shown) are located within waffle board. In this type of implementation, new PV cell layouts as discussed herein can be rapidly implemented simply by designing and fabricating a new waffle board, while leaving all other components unchanged.

Modeling Level Currents

We have compared models of our arrays generated as described above to models of the Kare arrays to examine the quality of each. Although current output from a PV cell is a function of the PV cell's I-V curve at a given illumination intensity and temperature and is not a single, fixed value, for purposes of modeling and comparison we assume that PV cells are operating near their maximum power point, and that intensity of illumination can be translated directly and approximately linearly into an output current. For each voltage level in an array, we define a "level current" that is the sum of currents from all of the PV cells in that voltage level. Just as each PV cell in a single series string should be equally illuminated so as to match the currents, an array will generally perform best when the level currents of each voltage level are approximately equal. Stated another way, the differences between level currents are preferably minimized. Ideally, a PV array would be designed so that the minimized differences between level currents are robust against power beam intensity profile variations or wander of the beam centroid—that is, that when the beam wanders slightly or its profile changes, changes of the differences between the level currents are minimized. Using the assumption described above that the current out of a PV cell is roughly linearly proportional to the input power, then for purposes of estimating the nominal current out of each PV cell our model uses the incident light on the PV cell as a proxy for PV cell current. The following description in connection with FIG. 14-FIG. 20 may use the terms "intensity," "power," "power intensity," "current," or "current density" interchangeably, since they are all assumed to be proportional to one another in this part of our model.

Figure 14:
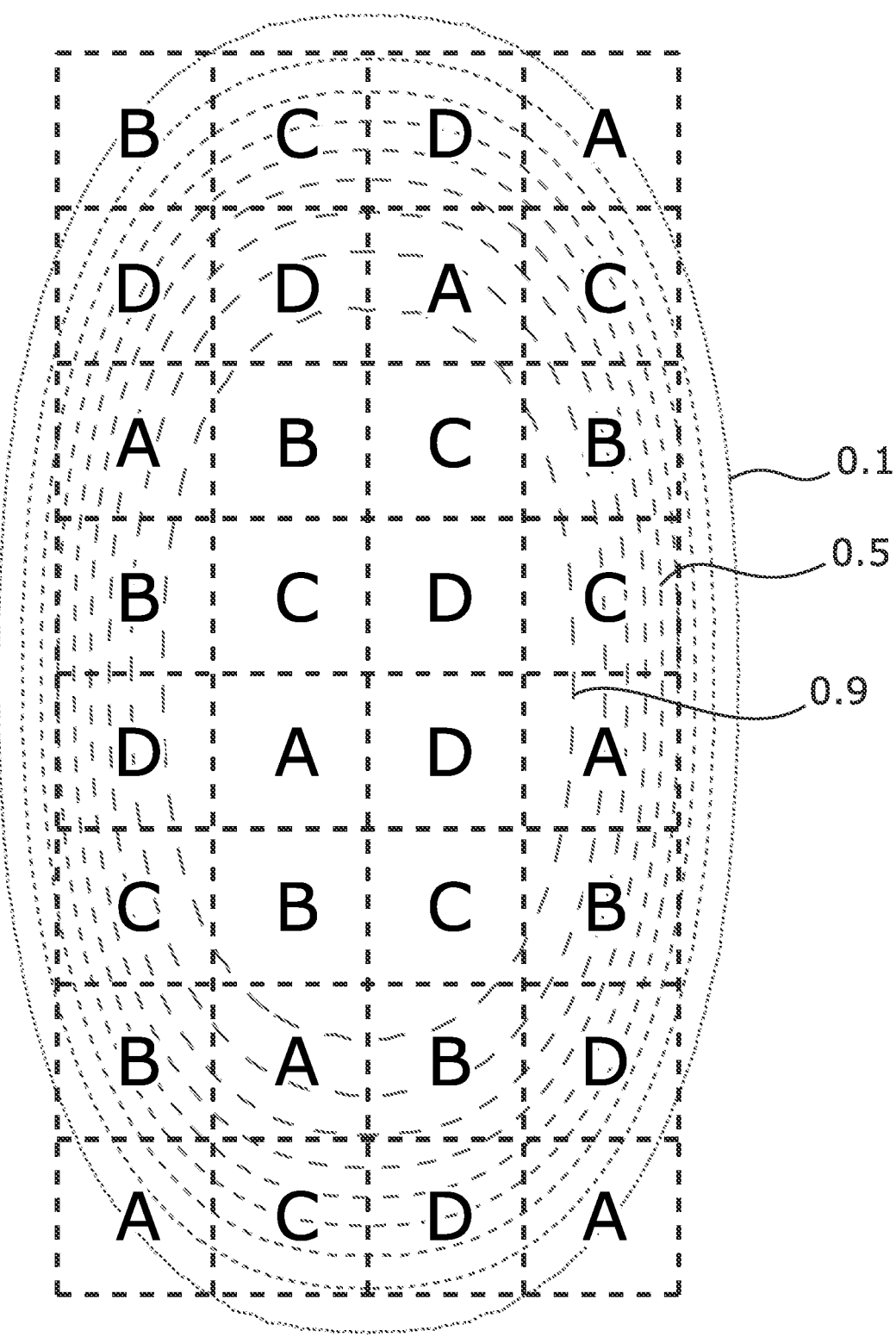
FIG. 14 shows a model beam profile for application to the array of FIG. 5(a).

To characterize our test arrays, we define "mismatch" as the difference between the maximum current and the minimum current, divided by the mean current and expressed as a percentage. We use the light intensity at the center of a PV cell as a proxy for its output current, since the total power across a PV cell's collection area is substantially equivalent to the power at its center for nonpathological beam intensity profiles. A more complete model might use intensity integrated across the area of the PV cell, but we have modeled this difference and found it to yield only negligible improvements, so we use the intensity at the PV cell center for computational simplicity. We then generate a "virtual" light beam profile with parameters to describe its width in major and minor axes, rotation angle relative to the PV array, an amount to which it approximates a rectangle or an ellipse, and an intensity profile (which is generally modeled as a super-Gaussian shape, with the super-Gaussian factor as one of the parameters). We use Monte Carlo methods to simulate moving and/or rotating the beam, and/or changing its profile. FIG. 14 shows an example beam profile designed to roughly approximate the shape and size of the Kare array shown in FIG. 5(a). The applied beam profile is elongated to match the aspect ratio of this 4×8 array, as shown in the illustration.

Our centered virtual light beam profile can be described by six input parameters as follows: $w_x$ and $w_y$ represent the beam width in the x and y directions. $\theta$ represents the rotation of the beam in the x-y plane, and $n_x$, $n_y$, and $n_{sG}$ represent super-Gaussian parameters of the beam profile. $n_x$ and $n_y$ apply separately to the x and y components and the larger these two parameters are, the closer the beam profile is to a rectangle (rather than an ellipse). $n_{sG}$ is the normal super-Gaussian factor, and the larger it is, the closer the beam profile is to a "top hat" profile instead of regular Gaussian. Beam intensity at a given location is then described by the following parameters:

Let a, b, and c be defined as follows:

$$a = \frac{\cos^2\theta}{2w_x^2} + \frac{\sin^2\theta}{2w_y^2}$$

$$b = \frac{-\sin^2\theta}{4w_x^2} + \frac{\sin^2\theta}{4w_y^2}$$

$$c = \frac{\sin^2\theta}{2w_x^2} + \frac{\cos^2\theta}{2w_y^2}$$

Intensity J at a point x, y is then described by:

$$J = J_0 e^{-\left(a(x^2)^{n_x} + 2bxy + c(y^2)^{n_y}\right)^{n_{sG}}}$$

For the purpose of comparing relative array performance, mainly with the mismatch, the absolute intensity value is irrelevant and so for ease of modeling the peak intensity $J_0$ is simply set to 1. In our Monte Carlo simulation, we then allow the beam to wander in the x- and y-directions, choosing positions with an applied error having a normal distribution with a selected standard deviation (shown in Table 1 as "Beam wander," which is expressed as a fraction of PV cell width), might be expected to occur naturally due to various sources of "noise" (from tracking, signal processing, mechanical motion, etc.) for a beam steering system. Note that the random position error is generated (in a normal distribution) separately for the x and y position errors. The above equation is shifted in the x,y plane to determine the intensity at the center of each PV cell location. 200 Monte Carlo runs were performed for each of the various cases discussed below. Table 1 shows the array parameters, beam profile, and Monte Carlo input factors for each case described below, along with relevant performance results.

TABLE 1

Figure 5A:
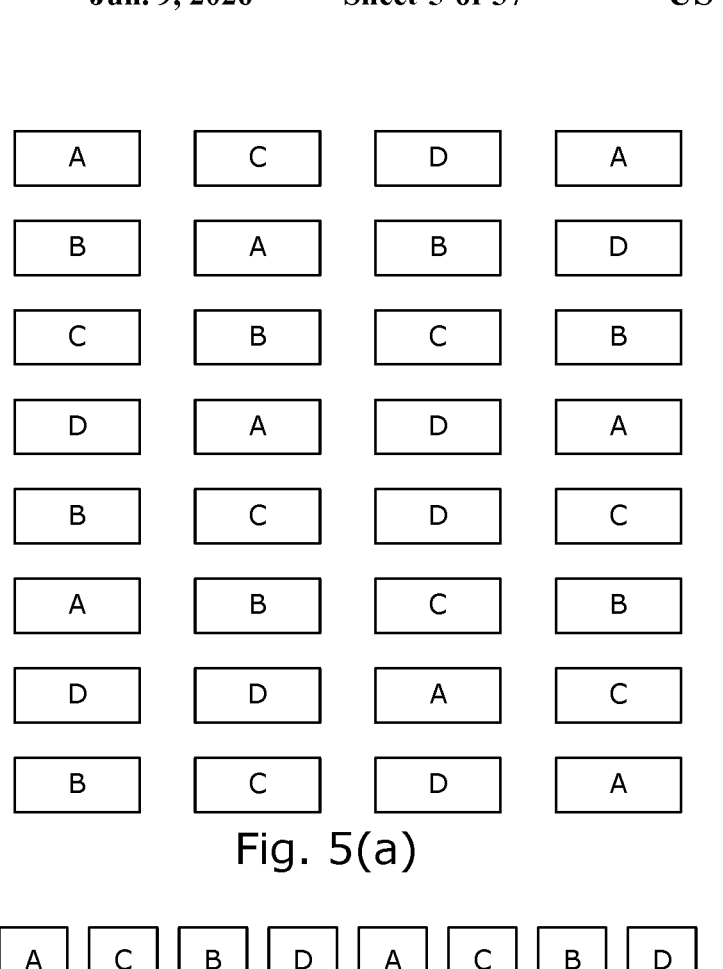
FIG. 5(*a*) shows the PV cell layout of FIG. 3 of Kare.
FIG. 5(b) shows the PV cell layout of FIG. 5 of Kare, "doubled" by placing two copies of Kare's depicted array side-by-side.
Figure 5B:
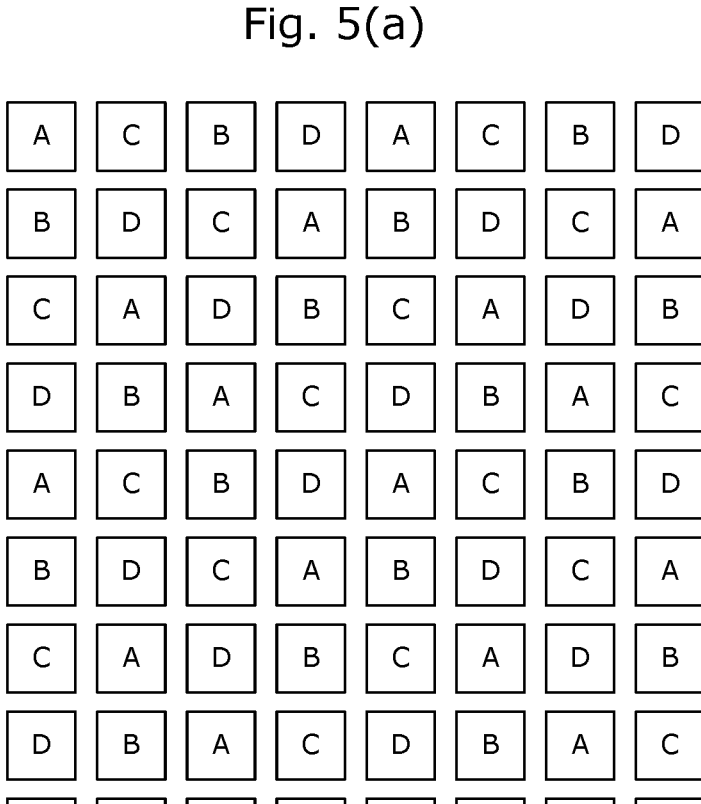

| | FIG. 4 | FIG. 5(a) | FIG. 5(b) | FIG. 7 | FIG. 11 | FIG. 13 |
|---|---|---|---|---|---|---|
| Number of voltage levels | 5 | 4 | 4 | 4 | 5 | 5 |
| Array "size" | 6 × 5 | 4 × 8 | 8 × 9 | 8 × 8 | 10 × 10 | 10 diameter "round" |
| Number of PV cells | 30 | 32 | 72 | 64 | 100 | 75 |
| Voronoi median aspect ratio | n/a | 1.88 | 1.5 | 1.25 | 1.33 | n/a |
| $w_x$ | 6.2 | 3.8 | 8.3 | 8.3 | 6.2 | 6.2 |
| $w_y$ | 6.2 | 7.6 | 10.2 | 8.3 | 6.2 | 6.2 |
| $\theta$ | 0 | 0 | 0 | 0 | 0 | 0 |
| $n_x$ | 1.0 | 1.2 | 1.3 | 1.3 | 1.0 | 1.0 |
| $n_y$ | 1.0 | 1.2 | 1.3 | 1.3 | 1.0 | 1.0 |
| $n_{sG}$ | 2.5 | 2.2 | 2.5 | 2.5 | 2.5 | 2.5 |
| Beam wander | 0.2 | 0.125 | 0.15 | 0.15 | 0.2 | 0.2 |
| Centered beam mismatch | 26.5% | 22.1% | 5.6% | 0% | 0.9% | 1.6% |
| Monte Carlo mismatch | 26.3% | 22.0% | 6.2% | 1.7% | 1.1% | 2.7% |

Figure 15:
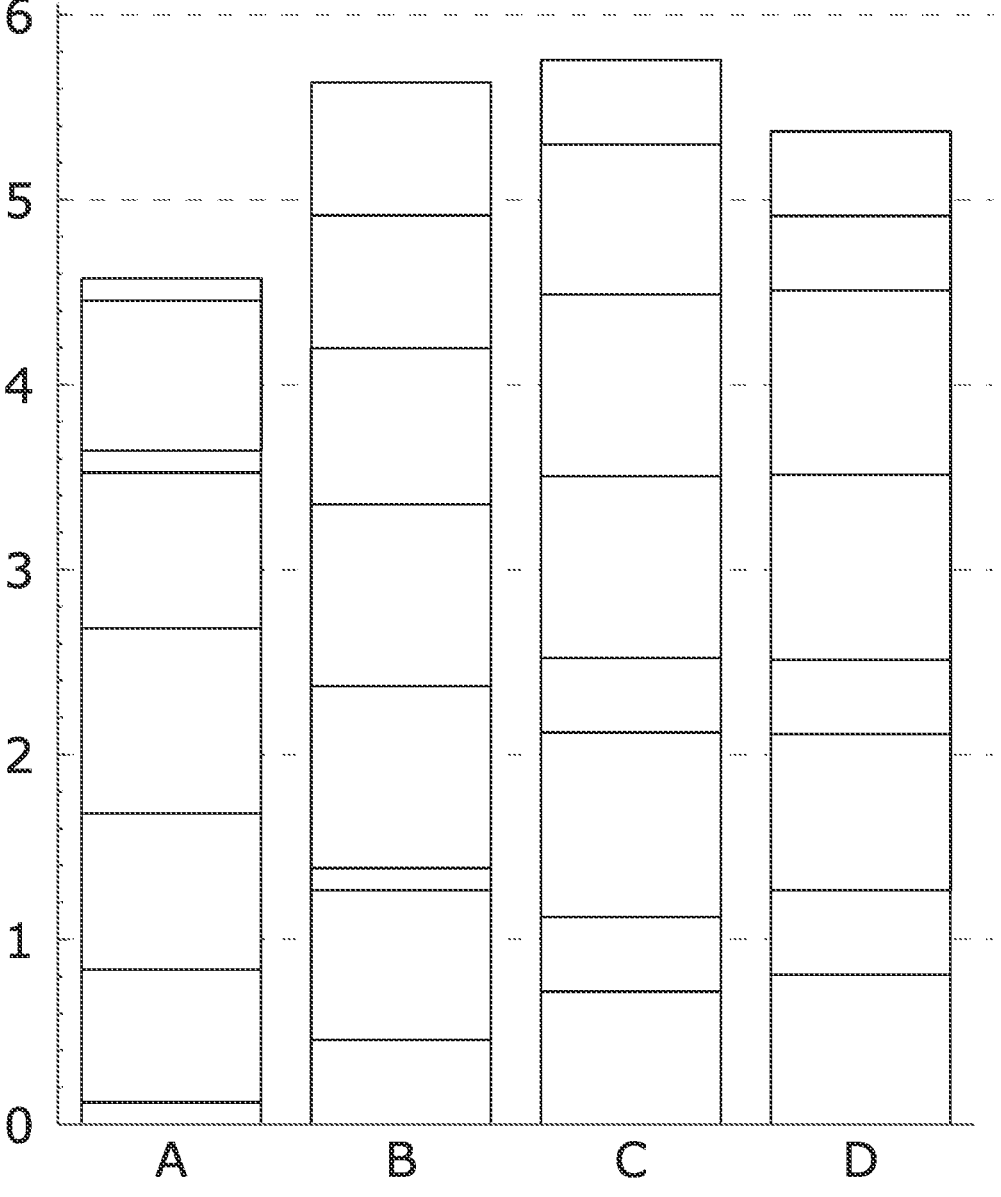
FIG. 15 shows modeled level currents for the array shown in FIG. 5(a).

When the Kare array depicted in FIG. 5(a) is modeled as described above, it performs relatively poorly, showing a mismatch of 22.1% for the beam profile shown in FIG. 14. The beam profiles in FIG. 14 and other figures show contour lines of constant intensity, ranging from 0.1 up to 0.9 (because the peak of 1.0 might be a single point in the middle of the beam, and low intensity below 0.1 out in the tails of the profile makes showing contours below 0.1 not important for this application). FIG. 15 shows stacked currents for each of the four voltage levels when the beam in FIG. 14 is centered on the array. Each white bar in FIG. 15 represents the current from a single PV cell, which are added together to form a total output current represented by the height of the stacked bars in each column for these parallel-wired PV cells. The mismatch (shown in Table 1) is apparent by inspecting the graph of FIG. 15, and indicates that the array shown in FIG. 5(a) substantially inferior to the arrays further described below. Ideally, each of these total currents shown in FIG. 15 would be the same, rather than stacking to different heights as shown.

Figure 16:
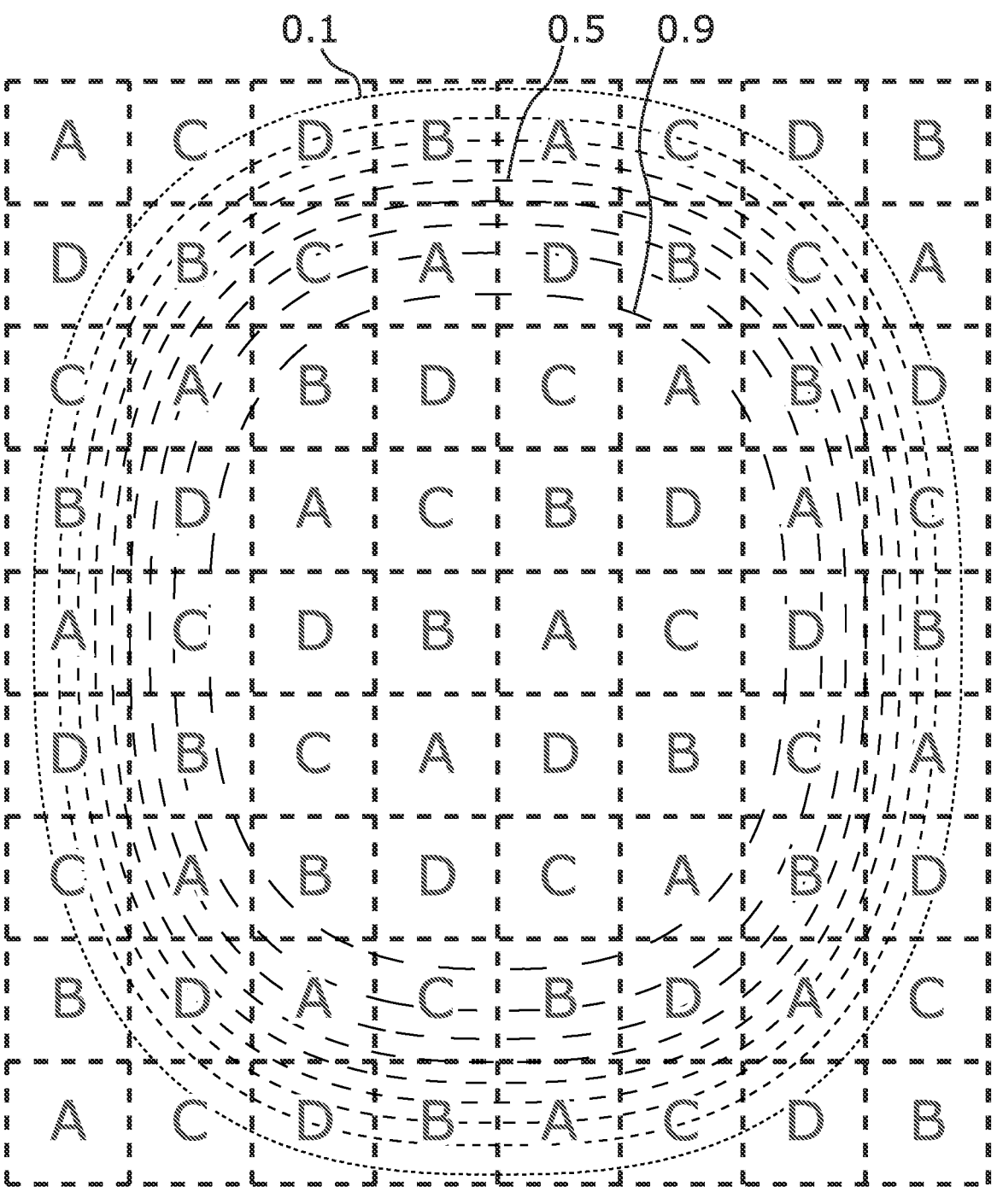
FIG. 16 shows a model beam profile for application to the array of FIG. 5(b).
Figure 17:
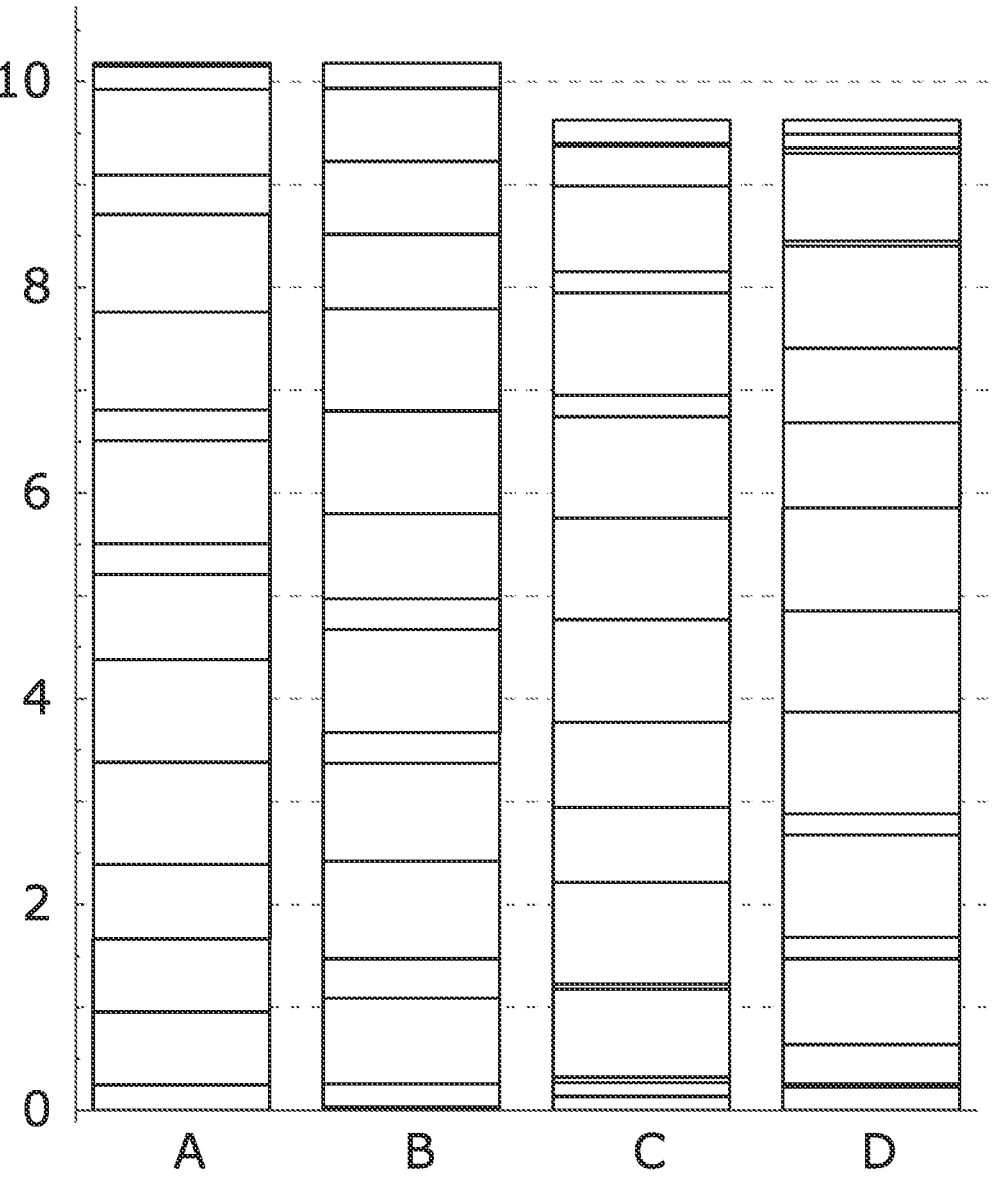
FIG. 17 shows modeled level currents for the array shown in FIG. 5(b).

When modeling the array shown in Kare FIG. 5, in order to more closely compare it with our arrays, which typically have overall aspect ratios near 1, we "doubled" the array (as suggested in Kare in the paragraph spanning pages 3-4), placing two identical array's side-by-side to create a 9×8 array of PV cells (instead of the 9×4 array of Kare) as shown in FIG. 5(b), and used a slightly eccentric beam profile to match the slightly non-square shape of the array. The beam shape and size were defined as described above, with the parameters listed in Table 1, and the x and y positions were varied in a Monte Carlo simulation as described above with a standard deviation listed in Table 1. One profile from the simulation is illustrated in FIG. 16: the size and eccentric chape of the beam profile are visible in the contour lines. This shape reflects a beam profile that might result when the beam designer tries to make a rectangular beam to match the array shape (Kare shows substantially rectangular beams), The stacked currents for each of the four voltage levels for the illustrated profile are shown in FIG. 17. The mismatch for this test configuration is less than that of the other Kare array, but still relatively high: 5.6% in the illustrated run and averaging 6.2% over all runs of the Monte Carlo simulation.

For closest comparison with the array performance shown in FIG. 17, we created an 8×8 array with four voltage levels, constructed using the design principles described above, as shown in FIG. 7. We used an 8×8 array (instead of a 9×8 array as in Kare) because it is more common to have a beam with an aspect ratio of 1 and therefore a receiver that has the same width and height, and in order to maintain a constant offset of 2 while still having the same number of PV cells at each voltage level. FIG. 18 shows stacked currents for the beam centered on the array as shown in FIG. 7. For the same beam profile shown in FIG. 16, mismatch was zero. The mismatch averaged over the simulation for all runs of this array was 1.7%, showing significantly better performance than the Kare array.

Figure 19:
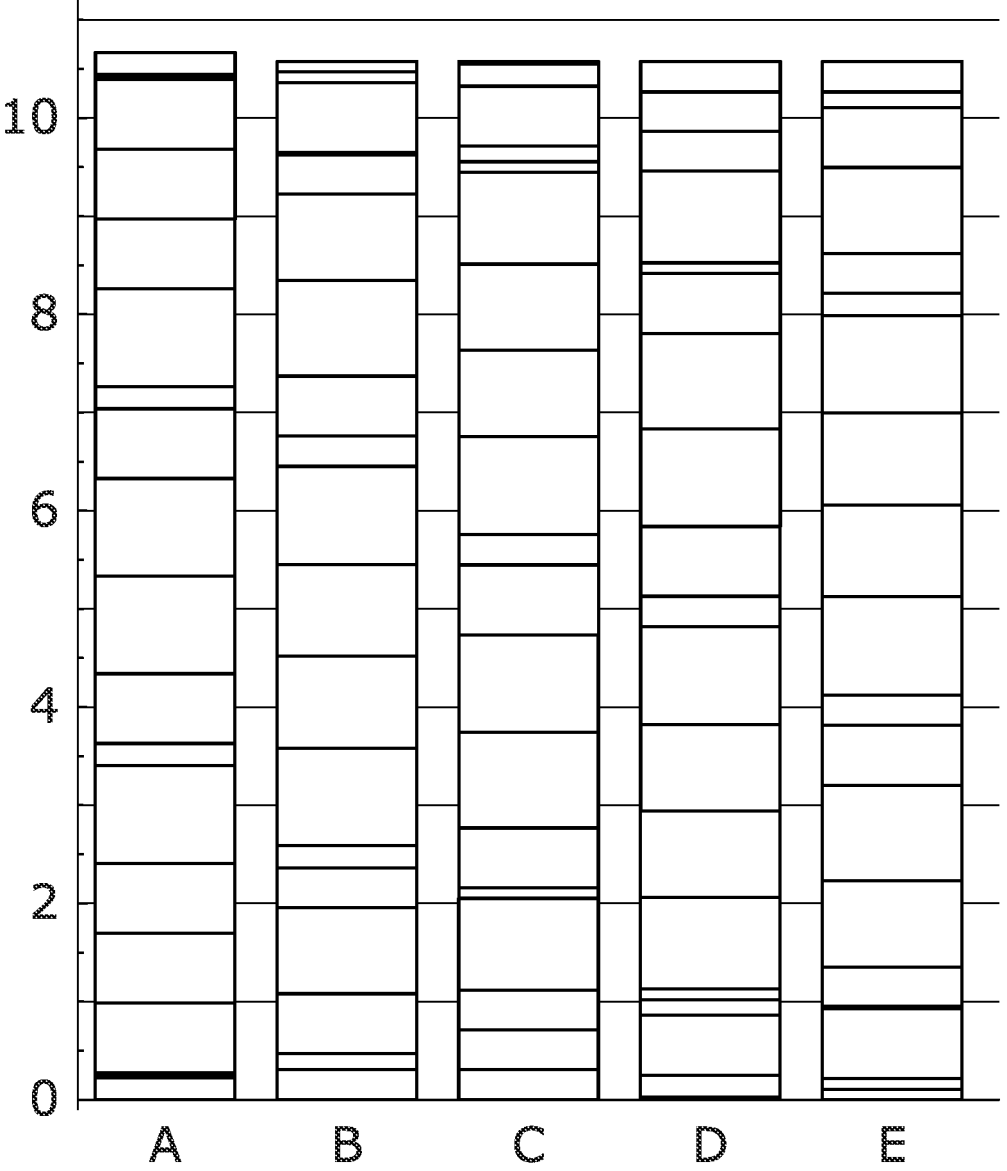
FIG. 19 shows modeled level currents for the array shown in FIG. 10.
Figure 20:
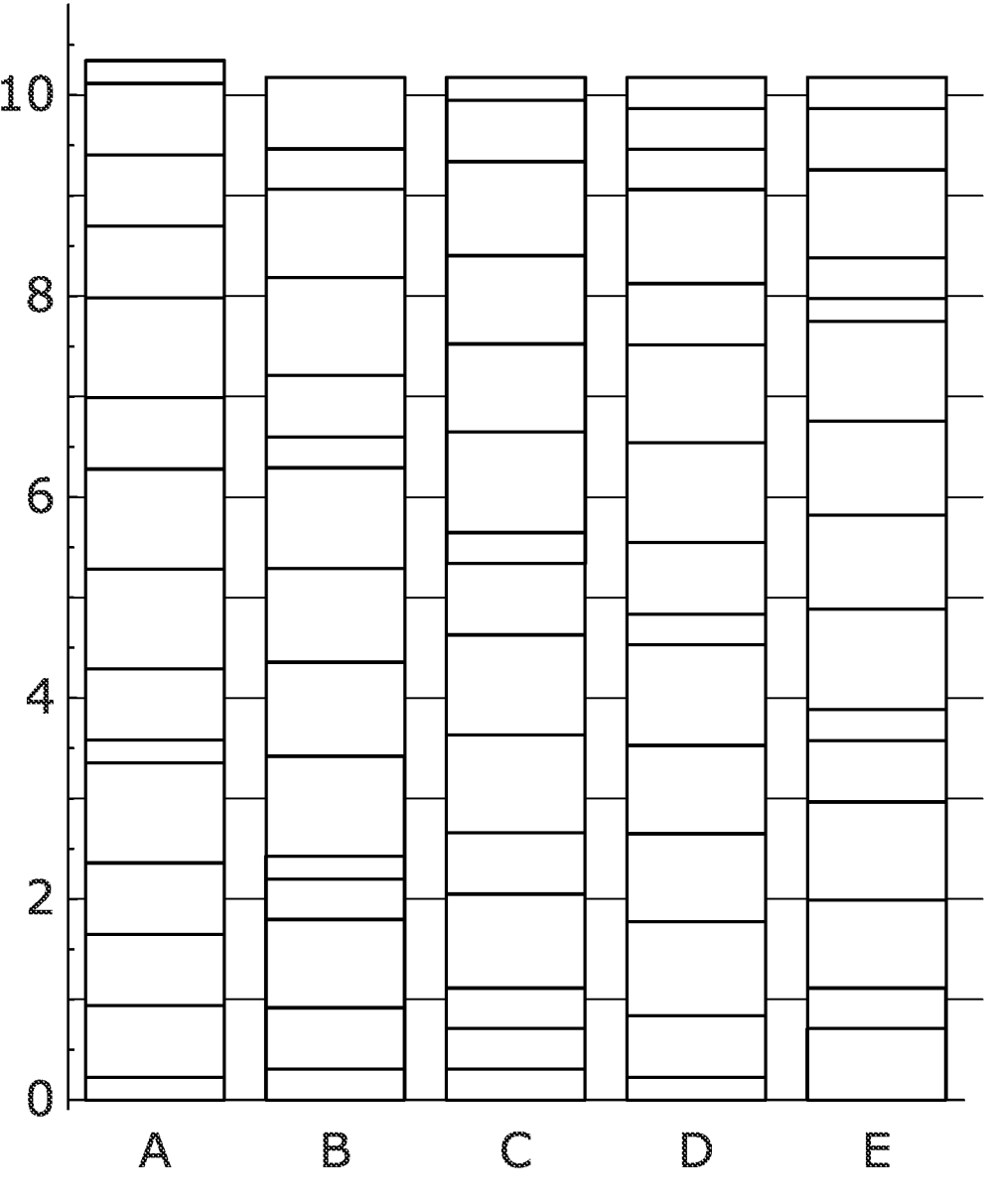
FIG. 20 shows modeled level currents for the array shown in FIG. 13.

By comparison, FIG. 19 and FIG. 20 show the same stacked currents graph for the centered-beam case for arrays shown in FIG. 11 and FIG. 13, respectively (i.e., the 10×10 array with 5 voltage levels, and that same array with some PV cells near the corners removed). Analogously to FIG. 7, FIG. 11 shows the substantially circular beam profiles used in modeling the responses of these two arrays. When the Monte Carlo simulation is performed for these two arrays, the average mismatch is 1.1% and 2.7%, respectively, showing that our array layouts are expected to have performance superior to those described in Kare. Review of Table 1 reveals that, as expected, lower Voronoi cell median aspect ratios are correlated with lower beam mismatches.

Addition of Resistance and Capacitance to Model

One potential objection to the wiring schemes described in the previous section is that distributing the cells of one voltage level evenly across an array may require significantly longer connections, so we developed a model that captured the electrical behavior of photovoltaic cells and resistors to examine the effects of resistance (as opposed to the earlier model, which made the simplifying assumption that PV output current was linearly proportional to illumination intensity, and that summed currents across each voltage level had to match each other). In addition, we believed that adding capacitance to the system might make the array more robust against scintillation, so we also modeled the effects of adding capacitors to the array.

Figure 21:
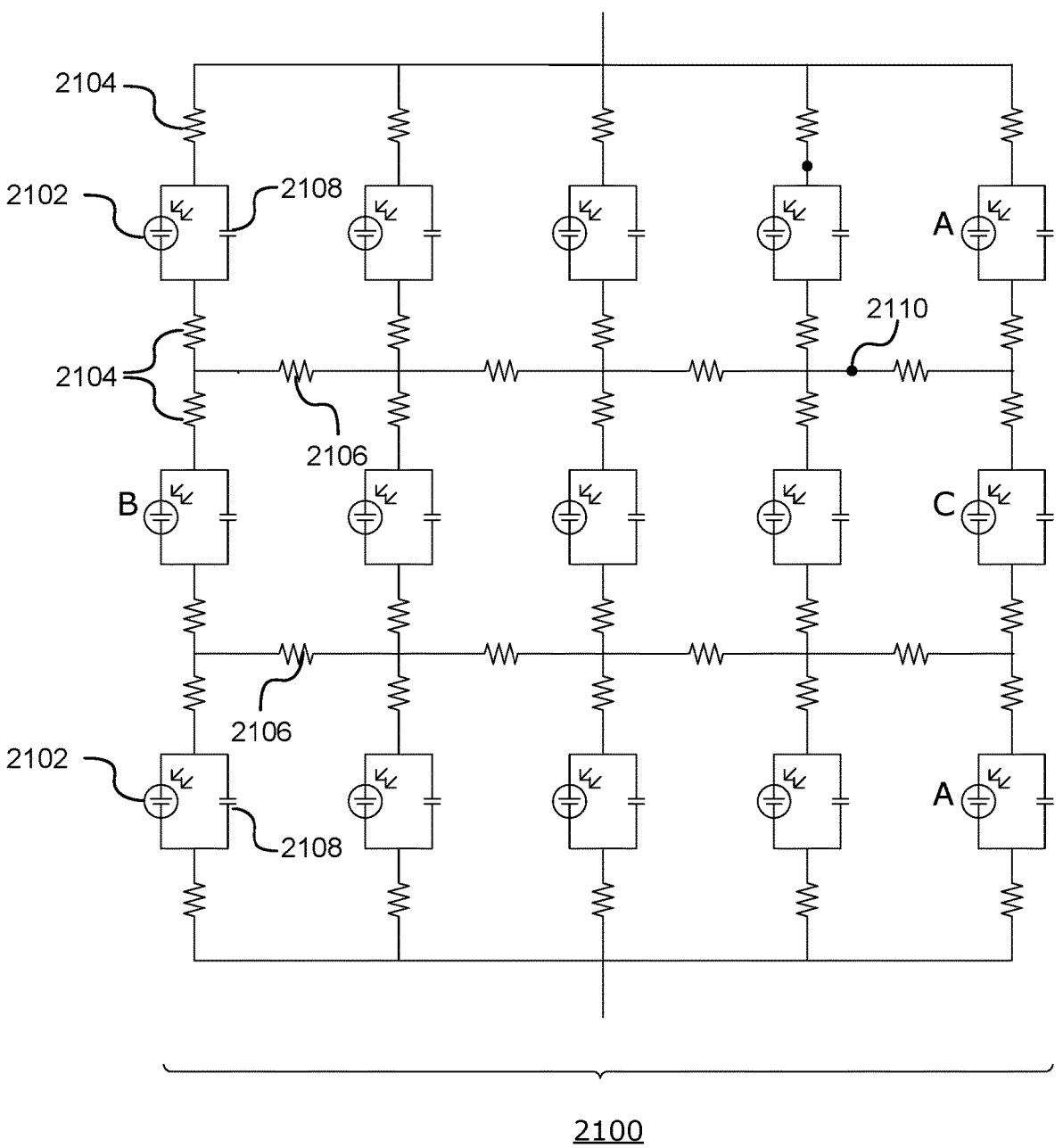
FIG. 21 shows an electrical schematic for adding resistance and/or capacitance to a modeled PV array.

FIG. 21 shows a 3×5 array 2100 of PV cells 2102 that was created in a virtual Simulink™ model in Matlab™. Cells are connected in parallel voltage groups as they are in FIG. 4, but "serial" resistors 2104 and "parallel" resistors 2106 were added between the PV cells as shown. In addition, each PV cell 2102 was placed in parallel with a capacitor 2108. (Not all components have been numbered for the sake of clarity of the figure, but all resistors shown in a vertical position are serial resistors 2104 and all resistors shown in a horizontal position are parallel resistors 2106.) By investigating various values of the resistance of serial resistors 2104 and parallel resistors 2106 (which could be set separately in the model) and of the capacitance of capacitors 2108, we were able to examine the response of the modeled system to resistance of the connections and to added capacitance when intensity on each of PV cells 2102 was varied. Current was measured at points 2110A and 2110B (and analogous points throughout the array). Under completely uniform illumination of the array, this current would be expected to be near zero (no net charge flowing "sideways" when all PV cells 2102 produce the same voltage).

The array shown in FIG. 21 has only a 3×5 array of PV cells 2102, a relatively small number that was selected for computational simplicity and modest run times, but those of ordinary skill in the art will understand how to construct and model a larger array according to the same principles. Like FIG. 4, FIG. 21 shows the electrical schematic of the modeled array, but a physical diagram would "spread" the PV cells 2102 across the surface so that they sampled different portions of a power beam. For purposes of creating this simple model, all serial resistors 2104 were set to a single value and all parallel resistors 2106 were set to a (potentially different) single value, but of course in a physical array, resistances might be different at different locations. For the board described above and in International Patent Application No. PCT/US22/13570 that included a copper "sheet" that connected all of the PV cells of a particular voltage group, the resistance between any two PV cells of that group would be expected to be approximately proportional to the (straight-line) distance between those two cells; in a system that connected cells of a group via wires instead of via a continuous sheet, resistance would be expected to depend on the cumulative length and gauge of the wires connecting any given pair. The latter case was easier to construct with the software used and thus was chosen for the model array shown.

Figure 22:
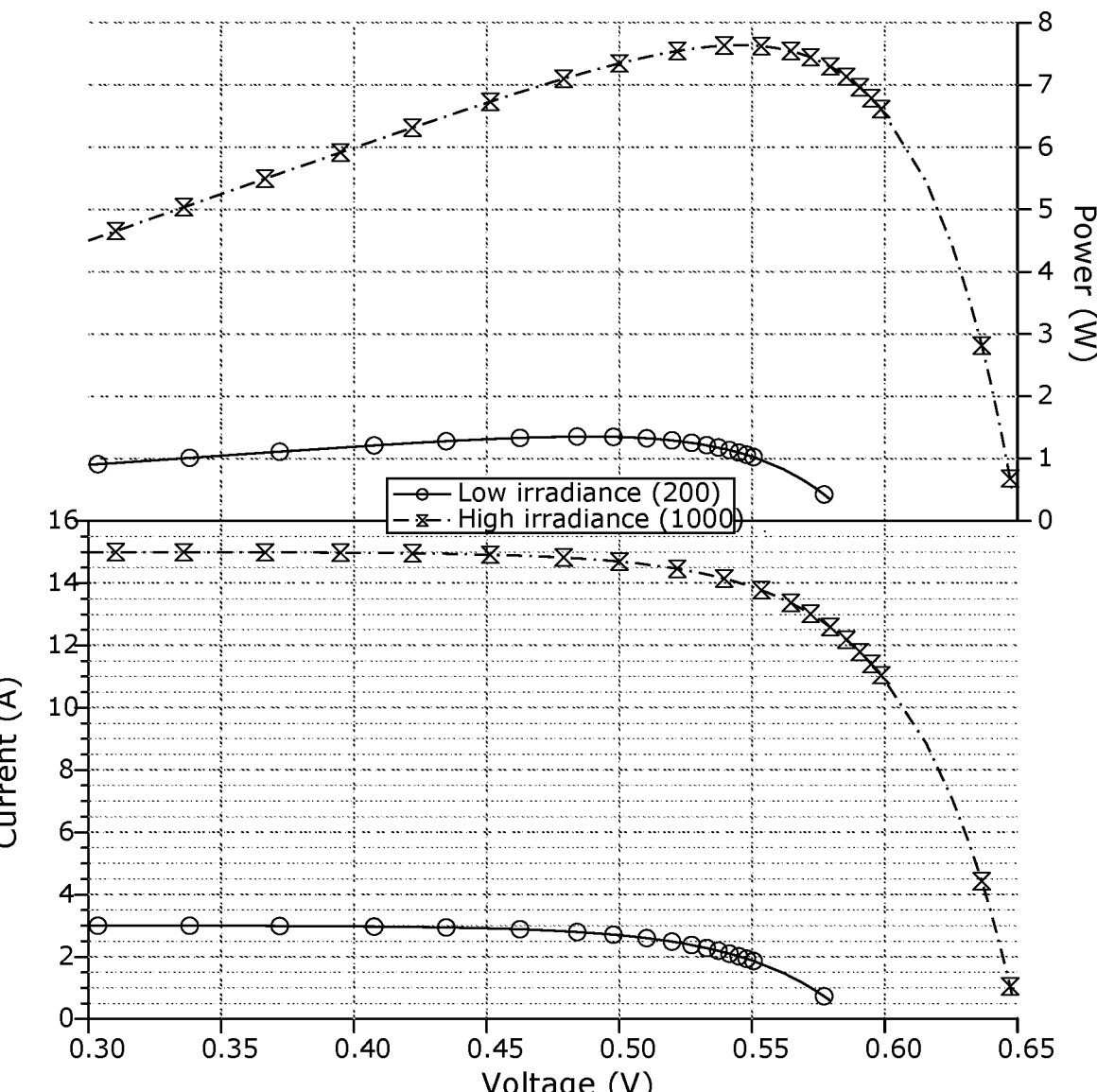
FIG. 22 shows P-V and I-V curves for the PV cells of FIG. 21 for two irradiances.
Figure 23A:
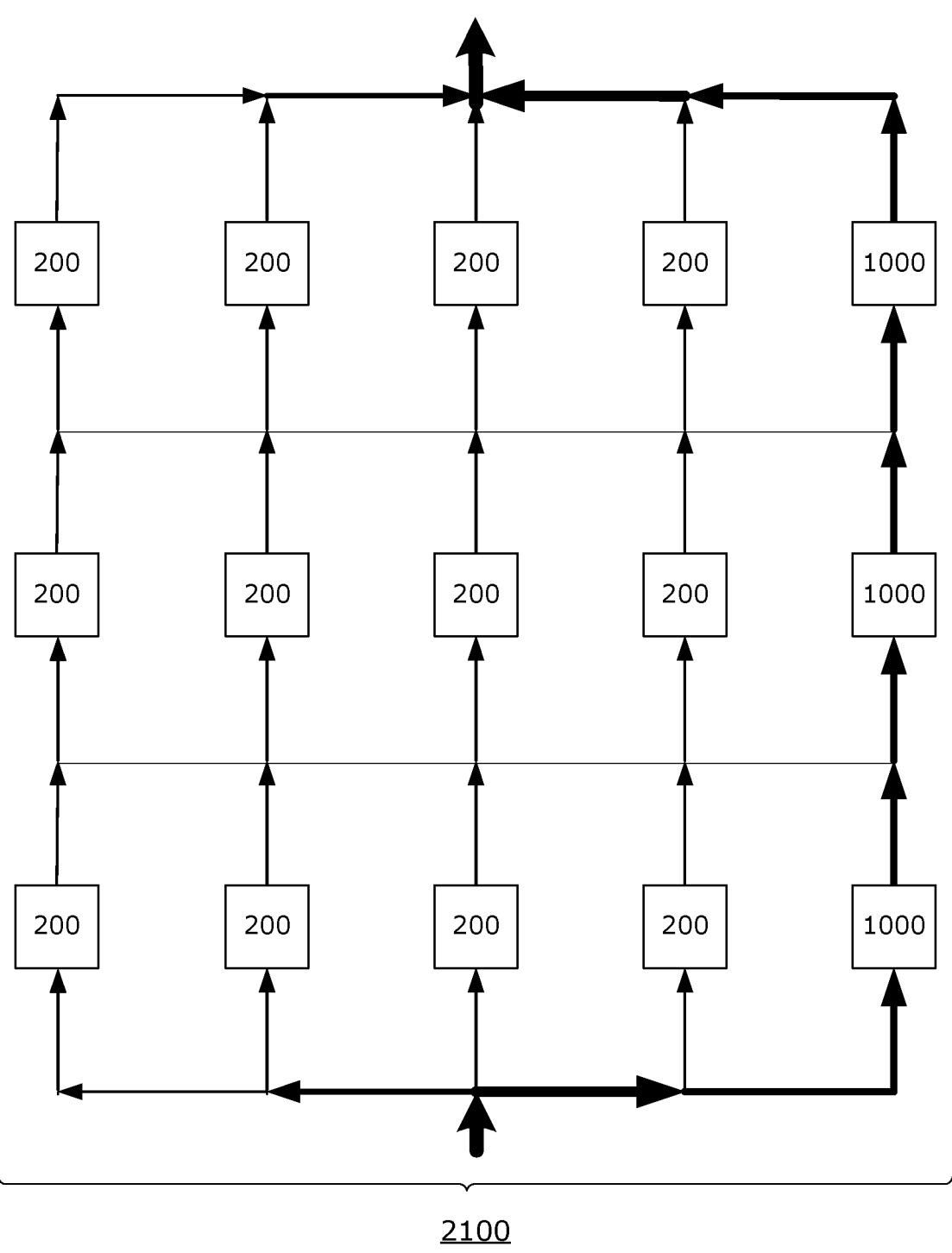
FIG. 23A and FIG. 23B (which may referred to collectively herein as FIG. 23) show currents flowing through the array under two illumination patterns.
Figure 23B:
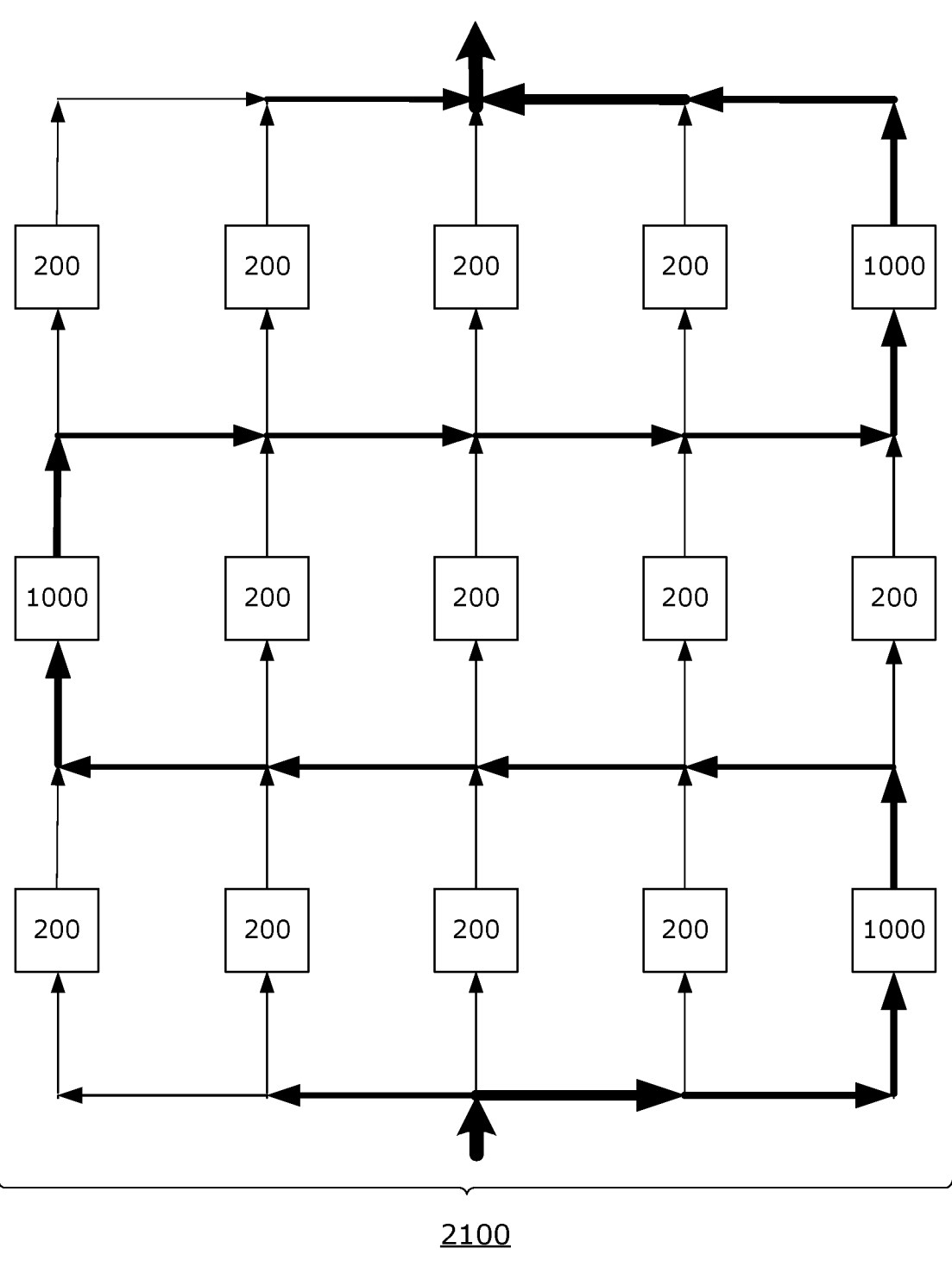

The I-V and P-V curves of a single model PV cell 2102 at two levels of simulated irradiance (200 and 1,000 in semi-arbitrary units) are shown in FIG. 22. The PV cells 2102 were chosen to simulate the current output of certain single junction cells that we use at high intensity in power beaming systems. For an irradiation pattern on the array, we "irradiated" the cells marked A with 1,000 units, and the cells not marked with a letter with 200 units. Cells marked B and C had their irradiation varied between 200 and 1,000 in a sinusoidal oscillation out of phase with one another (so that the total amount of irradiation at each voltage level was constant at 1,800 units). FIG. 23 shows qualitatively the currents we would expect to see in these two states, with FIG. 23A showing cell B at its peak illumination (and cell C at its minimum) and FIG. 23B showing cell C at its peak illumination (and cell B at its minimum). These diagrams are not to scale, but are intended to show qualitatively the magnitude of currents in different parts of the system as an aid to understanding.

We started by setting capacitance of all capacitors 2108 and resistors 2104, 2106 to zero. The maximum power output from a single PV cell 2102 for 200 units of irradiance is about 1.35 W, and for 1000 units of irradiance it is about 7.64 W. The ratio of the currents at the maximum power point is close to 5×, at just 5.04×, which supports the assertion in the previous section that output current is linearly proportional to the irradiance. The ratio of the two power outputs (5.66) is more than 5, because the PV cells become more efficient at higher intensities by slightly increasing the voltage at which the peak power occurs. Without resistance, the simulated array does not produce quite this much power, because of the voltage mismatch at the MPP between cells in each voltage level when one is more illuminated than the others. Since cells at the same voltage level are constrained to operate at the same voltage, the 200-unit-illuminated cells operate at a voltage slightly higher than their MPP, while the 100-unit-illuminated cells operate at a voltage slightly lower than their MPP, yielding an average power output of about 38 W, as can be seen below in FIG. 24. Once resistance is added, this mismatch is expected to be reduced due to the higher voltage drop in the conductors (copper sheet, wires, etc.) experiencing higher currents.

Figures 24, 25:
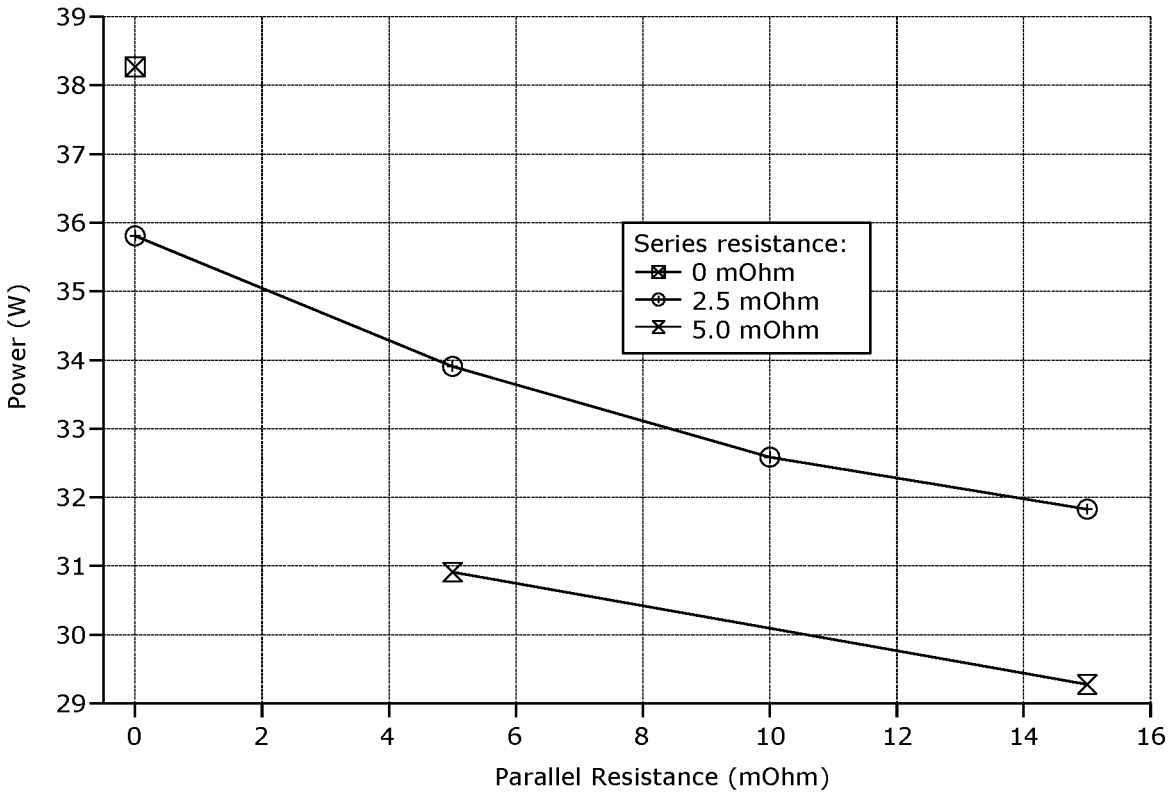
FIG. 24 shows power vs. parallel resistance for three different values of serial resistance.
FIG. 25 shows images of scintillation for different structure constants.

The next step in modeling was adding resistance to the system. Parallel resistors 2106 were set to 5, 10, or 15 mΩ, and serial resistors 2104 were set to 2.5 mΩ. (These numbers are of a similar magnitude to resistances measured from one PV cell to another of the same level and from one level to the next in the waffle board described above.) FIG. 24 shows average output power vs. parallel resistance for three different values of serial resistance. As expected, increasing either resistance reduces the overall output power due to ohmic losses.

During free-space power beaming, turbulence in the atmosphere creates scintillation of a projected laser beam, resulting in fluctuating intensity levels across an array. The deviation in beam intensity profile from what it would be if the beam were propagated through a vacuum (nominal intensity. $I_0$) can be extreme. Some examples of the variation in intensity that scintillation can cause are shown in FIG. 25. (These images are drawn from Vorontsov, Artem M., et al., "Atmospheric Turbulence Study with Deep Machine Learning of Intensity Scintillation Patterns." *Applied Sciences* 10 (22):8136 (2020), and are reproduced under a Creative Commons license available at creativecommons.org/licenses/by/4.0/legalcode). Each image is labeled with the structure constant $C_n^2$ of the atmosphere at the time the image was captured.

Figure 26:
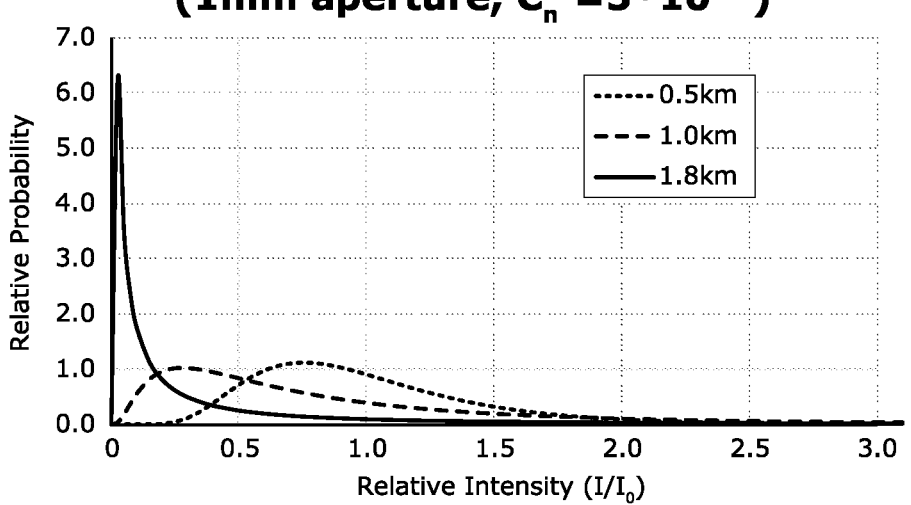
FIG. 26 shows a probability distribution function for scintillation at several distances for a 1 mm aperture.
Figure 27:
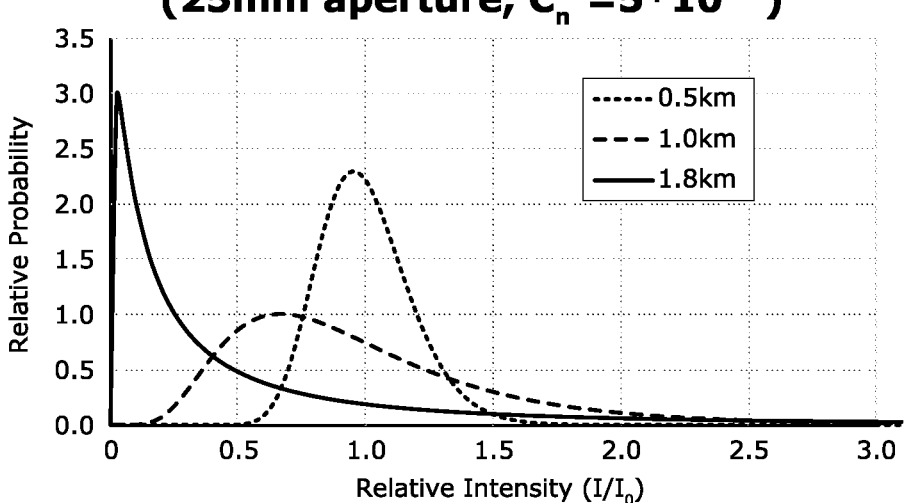
FIG. 27 shows a probability distribution function for scintillation at several distances for a 25 mm aperture.
Figures 28, 29:
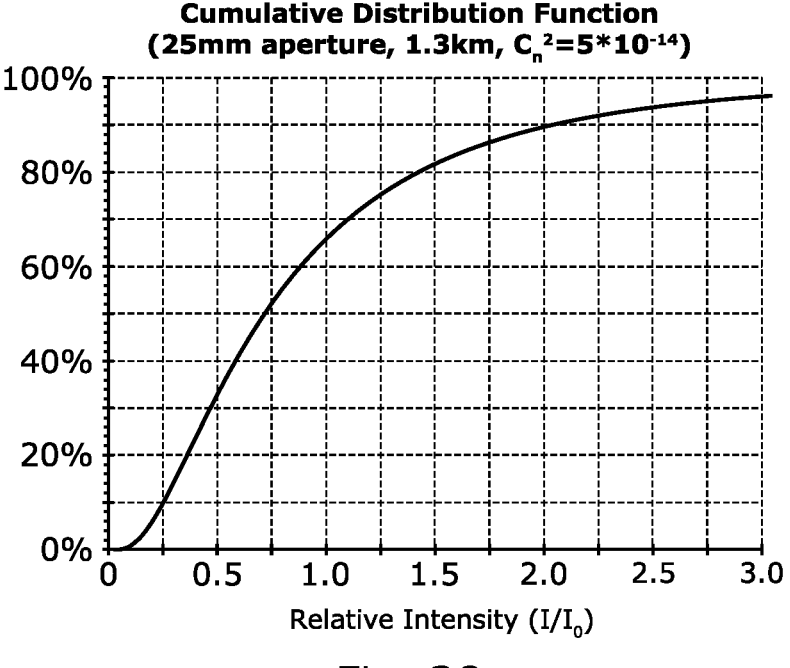
FIG. 28 shows the cumulative distribution function for scintillation for a range of 1.3 km with a 25 mm aperture.
FIG. 29 shows the probability distribution function for scintillation for a 200 mm aperture.

A commonly used theory for beam propagation in turbulent air (Kolmogorov spectrum), with assumptions including operating in the "weak" turbulence regime, predicts a log-normal probability distribution function (PDF) for the statistical variation in beam intensity at a point. Averaging the result across a finite width aperture narrows the PDF. The PDF for a 1 mm aperture with $C_n^2$ of $5*10^{-14}$ $m^{-2/3}$ for three distances is shown in FIG. 26, and the PDF for the same structure constant but a larger aperture of 25 mm (about the same size as a collection optic for one PV cell in some arrays that have been constructed) is shown in FIG. 27. From the PDF we can calculate the cumulative density function (CDF), which shows the fraction of the time any given intensity range will be seen. FIG. 28 shows the results for a range of 1.3 km with a 25 mm aperture. This graph indicates that, if one were to measure the intensity over a long time period at a high sampling rate (faster than the Greenwood frequency as described below), one would expect to measure intensity levels between 0 and 25% of the nominal ($I_0$) in roughly 10% of the measurements. Measuring between 0 to 100% of the nominal intensity $I_0$ would happen in about 66% of the instantaneous measurements. Measuring an intensity 2× or more times the nominal would happen in slightly more than 10% of the measurements. For a 20 cm aperture, the distribution gets narrower, because the aperture captures a large fraction of the entire beam, as shown in FIG. 29. The probability distribution function for an aperture larger than the entire beam (i.e., a receiver that captures all of the light) would be a Dirac delta function centered at $I_0$. At the smaller apertures (on the order of the optical aperture for a single PV cell), the total power is distributed among a wide range of intensities at varying size scales.

The minimum and maximum intensities used in the 3×5 array simulation have a ratio of 5×, which on the PDF/CDF graphs could be represented by $0.5*I_0$ and $2.5*I_0$, for example, or $0.25*I_0$ and $1.25*I_0$ (the exact values will depend on the baseline intensity chosen). As can be seen in the above graphs (as well as the images in FIG. 25), this amount of variation is not expected to be uncommon.

The Greenwood frequency is a measure of the rate at which atmospheric turbulence changes and is used to set lower limits on the control bandwidth for fast steering mirrors and/or adaptive optics. It depends on the value of $C_n{}^2$ and the distance:

$$f_{Greenwood} = \frac{0.1338}{\left(2.91 C_n^2 L v^{5/3} \left(\frac{2\pi}{\lambda}\right)^2\right)^{-3/5}}$$

where L is the range, v is the wind velocity, and $\lambda$ is the wavelength. Values for the Greenwood frequency can be as low as ~10 Hz at moderate distances and relatively calm conditions, or up to more than 200 Hz at longer ranges and/or when the air is very turbulent (e.g., on a sunny day over asphalt).

Scintillation can have a significant deleterious effect on an FSP system, especially when the system is designed to be used at long beam lengths (e.g., more than 100 m, more than 300 m, more than 500 m, more than 750 m, more than 1 km, or more than 2 km). We hypothesized that in a power receiver exposed to a beam whose intensity redistributes itself fairly rapidly (such as a free-space power beam subject to scintillation), adding capacitance to the system would reduce the amount that current "sloshes" back and forth between the varying higher intensity PV cells through parallel resistors 2106. Capacitors 2108 may support voltage produced by PV cells 2102 when the light intensity dips and may reduce voltage by accumulating more charge when the light intensity increases, reducing ohmic losses due to current flowing through parallel resistors 2106 by partially equalizing the voltages produced by each cell. For this simulation, we chose to vary the intensity at a rate of 100 Hz (period of 10 ms), with the sinusoidal variation described above between the PV cells 2102 labeled B and C. Of course, the intensity fluctuations in the real world would not oscillate back and forth between two values (the intensity would instead redistribute itself unpredictably over a wide range of values), but for ease of simulation and illustration we used a simple sinusoidal function as described above. The conditions were chosen for this simulation to emulate a realistic case that might be worse than average, but by no means rare, to highlight the potential impacts.

Figure 30:
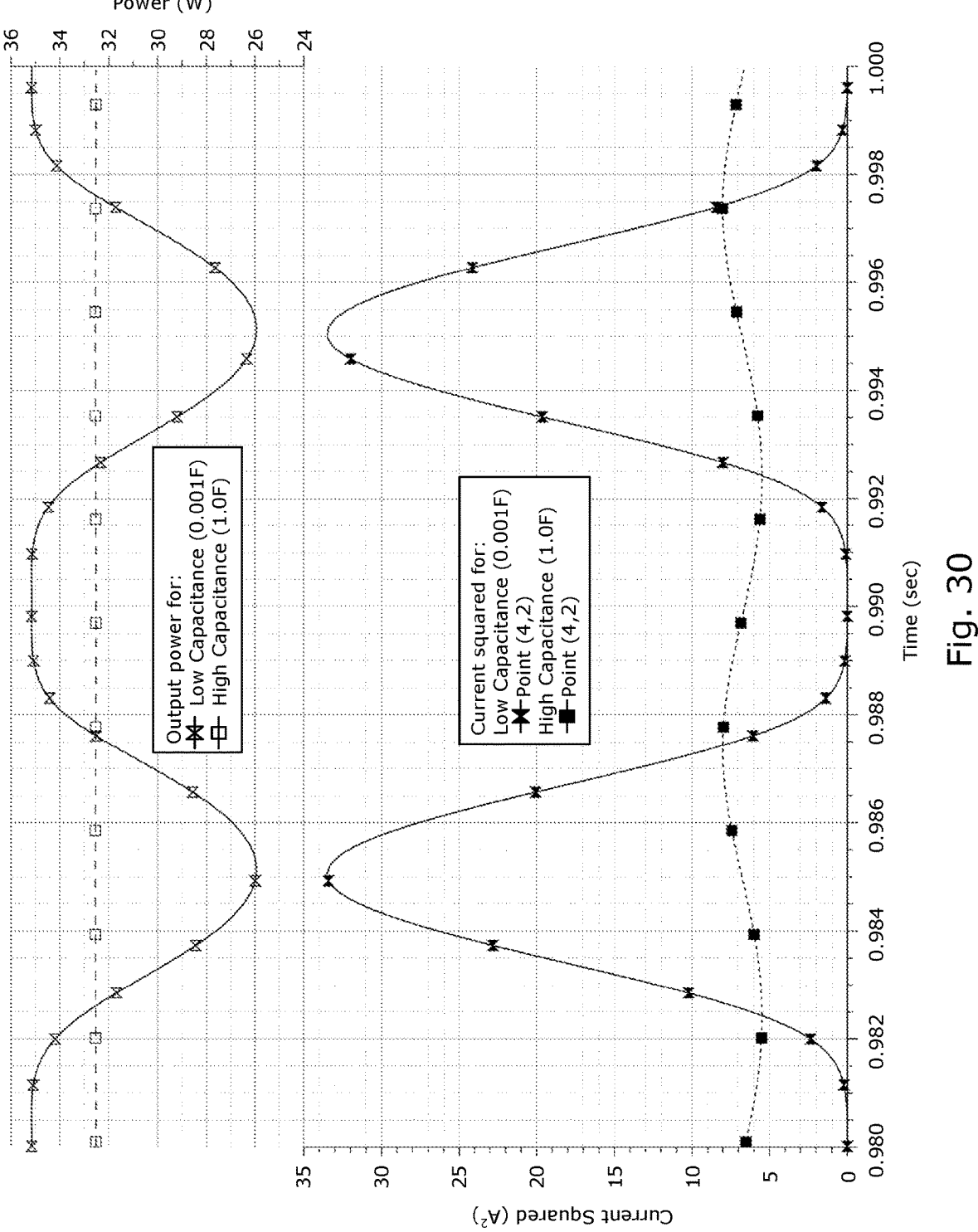
FIG. 30 shows the current and the square of the current through the resistor at the position marked 2110 in FIG. 21.

FIG. 30 shows the square of the current (bottom) through the resistor at the position marked 2110 in FIG. 21 for two modeled cases: an added capacitance of 0.001 F (which for this example is effectively the same as zero capacitance, but we mostly did not simulate zero capacitance for reasons of computational expediency), and an added capacitance of 1.0 F. We show the squared currents because the power lost through a resistor is proportional to the square of the current: $P_{loss}=I^2R$. Therefore, the power lost will also increase as the parallel resistance increases. The top of FIG. 30 shows the output power from the array for each of these cases. The average power for low capacitance is 32.17 W, and the average power for high capacitance is 32.54 W. While there is not a large change in the average power in this example (about 1%), the relatively constant power output associated with the higher capacitance is also desirable in some implementations.

Figure 31:
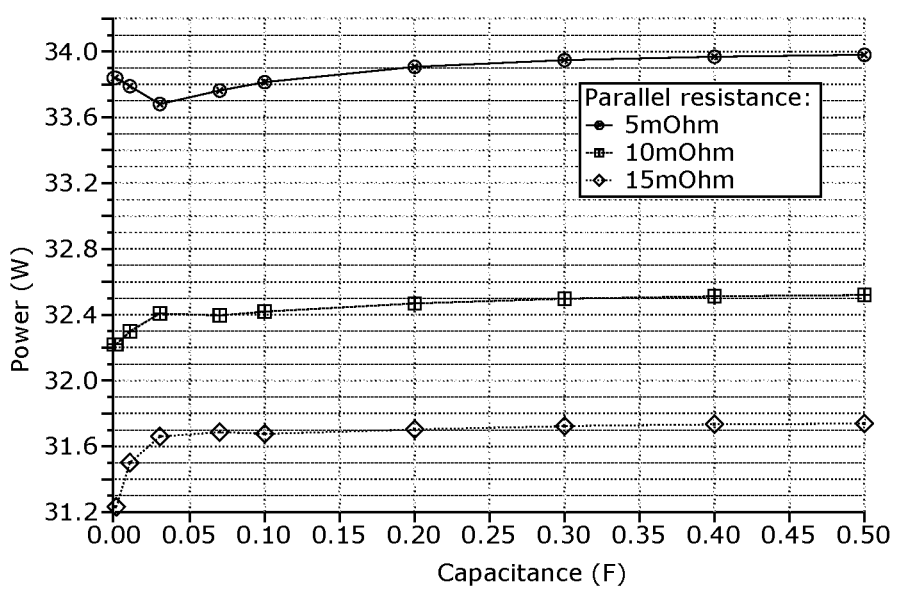
FIG. 31 shows the output power vs. capacitance for the three tested values of parallel resistance.
Figure 32:
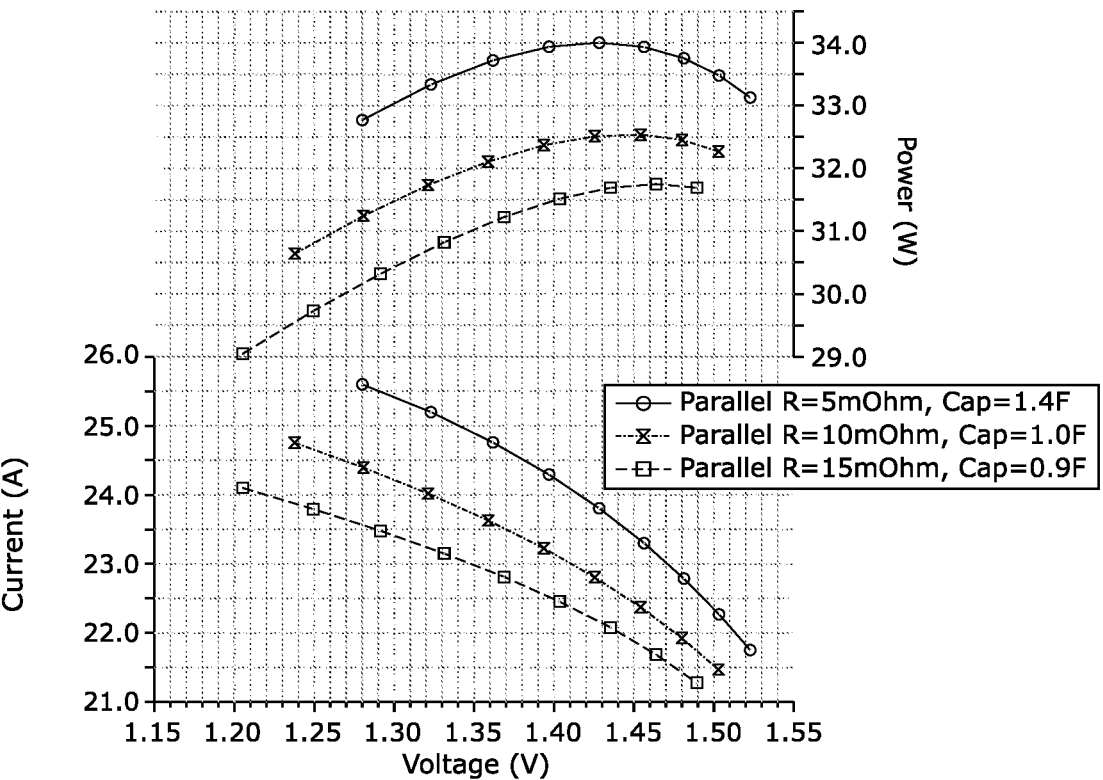
FIG. 32 shows the output power and current as a function of voltage of the array at the three tested values of parallel resistance.

FIG. 31 shows the time-averaged output power vs. the capacitance for each of the three tested values of parallel resistance. Each curve is shown at the load value that gives the maximum average power output. FIG. 32 shows the time-averaged output power and current as a function of voltage of the array at the three tested values of parallel resistance, where each illustrated curve is shown at the value of capacitance that gave the highest output power at the maximum power point from the data shown in FIG. 31.

Figure 33:
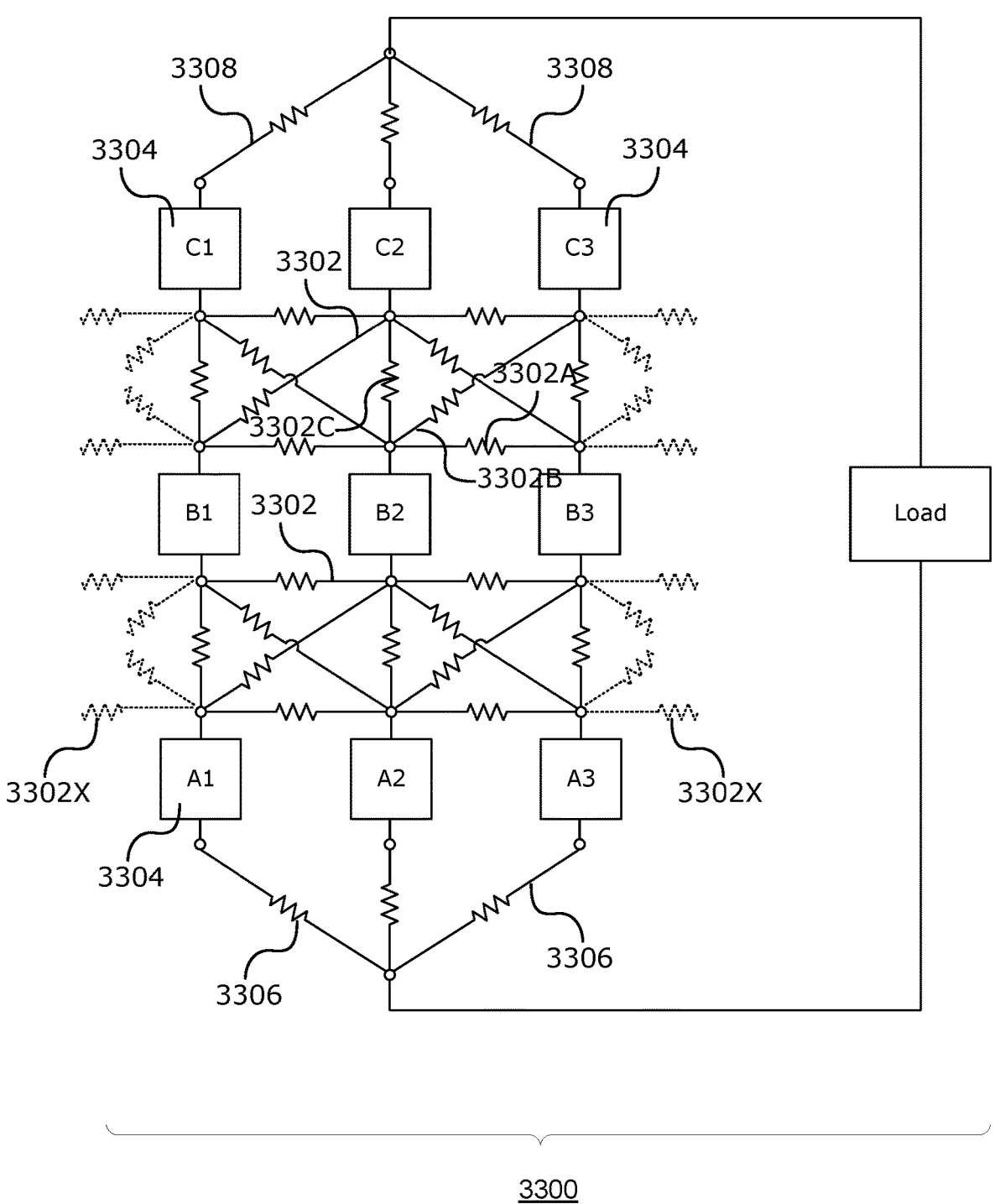
FIG. 33 shows an electrical diagram for another model of a PV array.

An electrical model of the array 3300 shown in FIG. 33 was constructed using PySpice to further test for appropriate values of capacitance and to model scintillation. For the sake of clarity of illustration, the Figure shows the electrical connections between voltage levels for a 3×3 array; however, most of this modeling was performed on analogous 8×8 arrays. Illustrated is an electrical wiring schematic similar to FIG. 4, where distance between components in the illustration does not reflect their physical spacing; the physical arrangement of cells was modeled by varying the resistance of resistors 3302 as described below.

Figure 34:
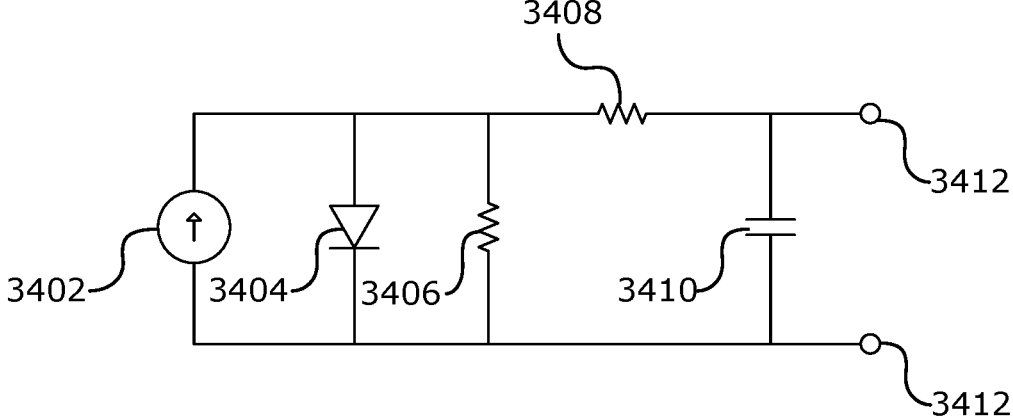
FIG. 34 shows one of the PV cell assemblies of FIG. 33.

Modeled PV cell assemblies 3304 are shown as A1, A2, A3, B1, B2, B3, C1, C2, and C3. A detail of each assembly is shown in FIG. 34 and described below. The PV cell assemblies are connected from one voltage level to another by a "web" of resistors 3302. At the bottom voltage, level A (comprising PV cell assemblies A1, A2, and A3) is connected to the load by three (in this diagram) resistors 3306, while at the top, level C (comprising PV cell assemblies C1, C2, and C3) is connected to the other terminal of the load by three resistors 3308. The resistance for each resistor 3302, 3306, 3308 of the web was determined by the physical distance between the two nodes that it connected and the American wire gauge of the copper wire modeled in the connection. (Smaller gauges of wire have a higher resistance per length of wire. Table 2 below shows the resistance values used for different wire gauges, taken from www.daycounter.com/Calculators/AWG.phtml.) For example, resistor 3302A connects nodes adjacent to PV cell assemblies B2 and B3 (forming part of a parallel connection between these assemblies), while resistor 3302B connects nodes adjacent to PV cell assemblies B2 and C3 (forming a serial connection between them), and resistor 3302C connects nodes adjacent to PV cell assemblies B2 and C2 (forming a serial connection between them). Each of these connections had a resistance set by the physical distances between PV cell assemblies, which may not be adjacent as shown in FIG. 33. Note that the connections "wrap around" the electrical diagram, with resistor 3302X connecting the node 3310 connected to PV cell assembly A1 to the node 3310 connected to PV cell assembly A3, for example. (The model has only one resistor 3302X, shown twice in the diagram, with dashed lines at both edges, to illustrate this "wrap around." All of the wrapped-around resistors are shown twice with dashed lines in FIG. 33 to illustrate this connection.) This model did not allow variation in the gauge selected (and therefore the calculated resistance) for diagonal and straight resistors 3302, but this could be varied in a future model if desired.

TABLE 2

| American wire gauge | Resistance (Ω/m) |
|---|---|
| 5 | 0.00103 |
| 10 | 0.00328 |
| 15 | 0.0104 |
| 20 | 0.0333 |
| 25 | 0.106 |

FIG. 34 shows the PySpice model schematic for each PV cell assembly 3304. Each 2.5 mm square PV cell was modeled as a current source ($I_L$) 3402, diode 3404, shunt resistor ($R_{sh}$) 3406, and series resistor ($R_s$) 3408, connected as illustrated. This PV cell was placed in series with capacitor 3410 and connected to resistors 3302 (not shown in this figure) at terminals 3412. The current $I_L$ was calculated by integrating the optical power incident on each PV cell, assuming single junction cells exposed to a wavelength of 1,075 nm, with an external quantum efficiency (EQE) of 0.794, ideality factor of 1.26, and saturation current of $3.36 \times 10^{-11}$ amperes, values that were obtained by measuring a single-junction PV cell optimized for 1,075 nm light. The shunt resistance $R_{sh}$ and series resistance $R_s$ in the model were set at 100 kΩ and 0.0149Ω, respectively. The capacitance of capacitor 3410 was varied from 1 μF to 1.0 F during the modeling as further discussed below. This model did not attempt to determine effects of using different capacitance values in different locations.

The electrical model illustrated above was modeled with beams having various levels of scintillation. The starting beam was modeled as a square super-Gaussian with exponent 3, half-width of 5.867 cm, and a peak (un-scintillated) integrated power on a single PV cell of 25 W. The beam profile and the power at each PV cell in the 8×8 array of the un-scintillated beam are illustrated in FIG. 36A and FIG. 36B, respectively.

Figure 37:
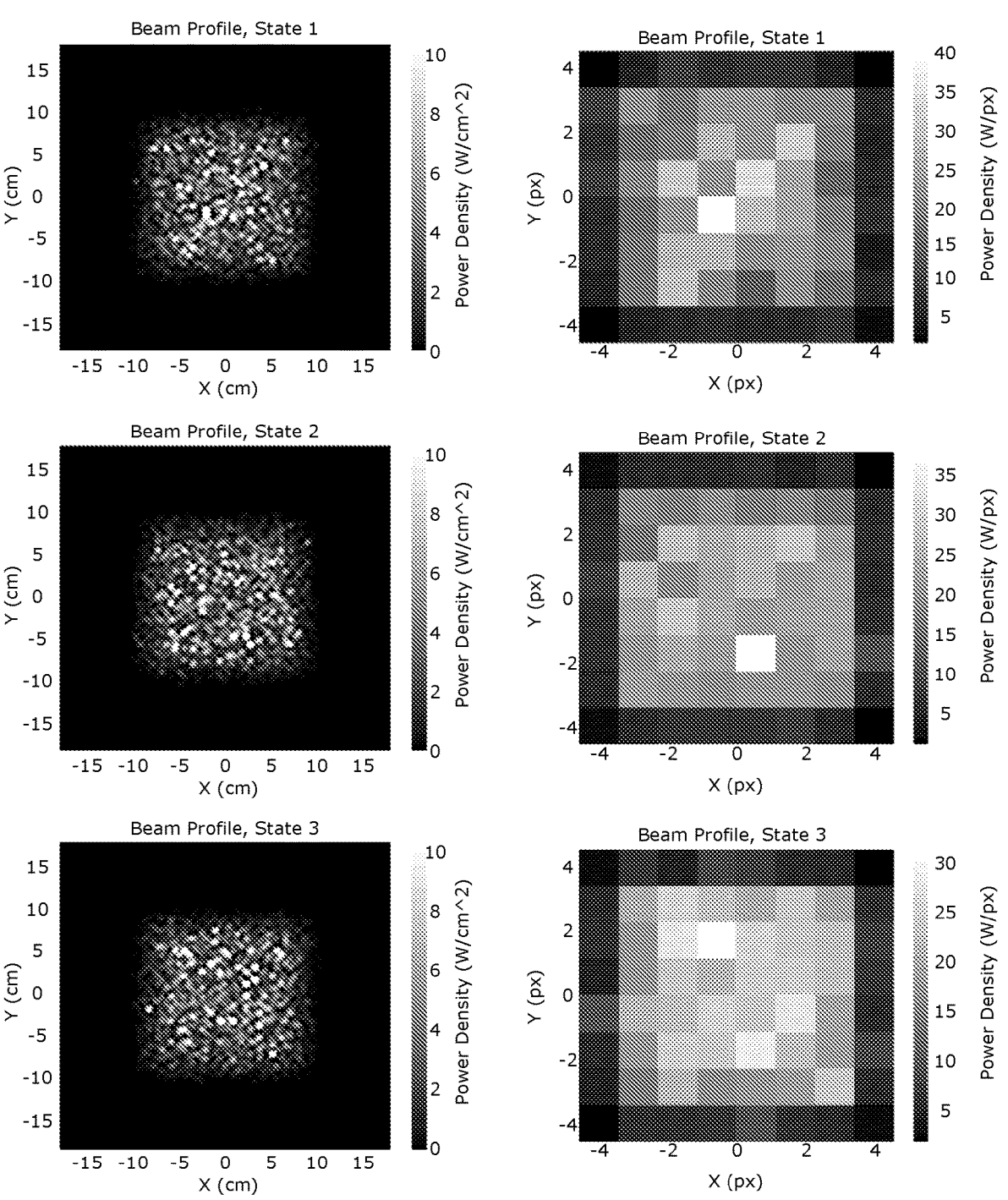
FIG. 37 shows the intensity of several time steps of a scintillated beam of the same power as shown in FIG. 36 on the left, and the corresponding intensities integrated over each cell of an 8×8 PV array on the right.

Scintillation was modeled on the beam shown in FIG. 36 at a frequency of 200 Hz (5 ms time steps between independent states), using a Kolmogorov model with turbulence parameter $C_n^2$ of $2 \times 10^{-13}$ $m^{-2/3}$ at a 2 km distance. Irradiance modifiers were calculated along a grid with length equal to the Fried parameter, using a lognormal distribution with unit mean and variance based on the Rytov variance $\sigma_R$ as $0.4 \times \sigma_R$; both the Fried parameter and Rytov variance were calculated from the turbulence parameter and distance specified above with a wavelength of 1075 nm. Values between these grid nodes were calculated via cubic interpolation, roughly preserving the underlying statistics. This modifier grid was multiplied with the beam function to obtain a scintillated state. The calculation began with an un-scintillated beam and followed with 80 scintillated states. Brent optimization was used to find the ideal load with an un-scintillated beam, and this load was used during transient calculations. Three of the scintillated states are illustrated in FIG. 37, with the corresponding intensity values integrated over each PV cell of the 8×8 array, to give an impression of the amount of scintillation. The electrical Py Spice model used time steps of 10 μs, determining the optical power incident on each PV cell at each time step as discussed above.

Figures 35, 36A, 36B:
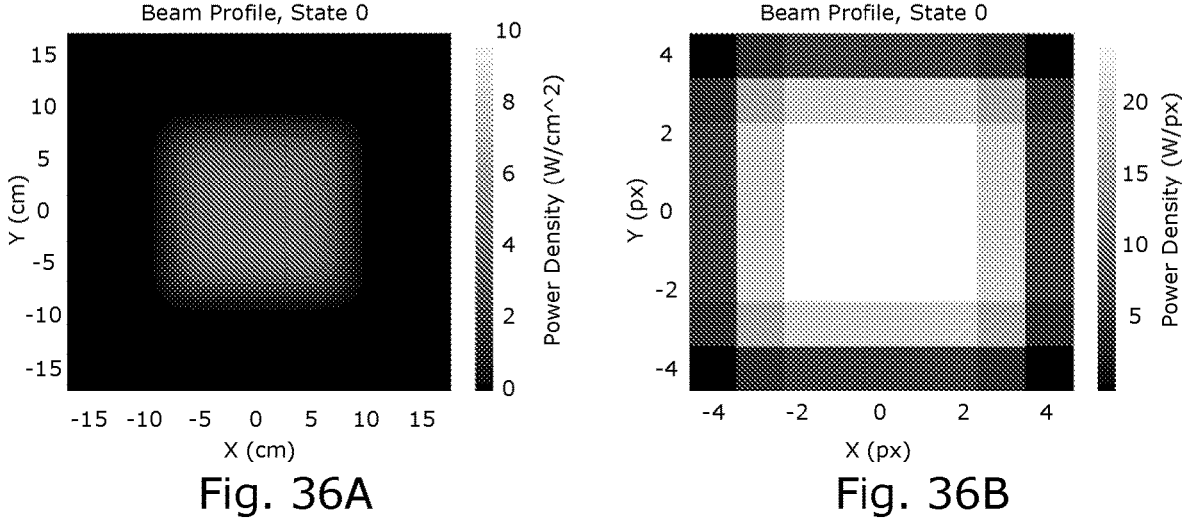
FIG. 35 shows an 8-level PV cell layout used for modeling.
FIG. 36A shows the intensity of an un-scintillated beam.
FIG. 36B shows the same intensity integrated over each cell of an 8×8 PV array wired as shown in FIG. 33 and FIG. 34. These figures may referred to collectively herein as FIG. 36.
Figure 38:
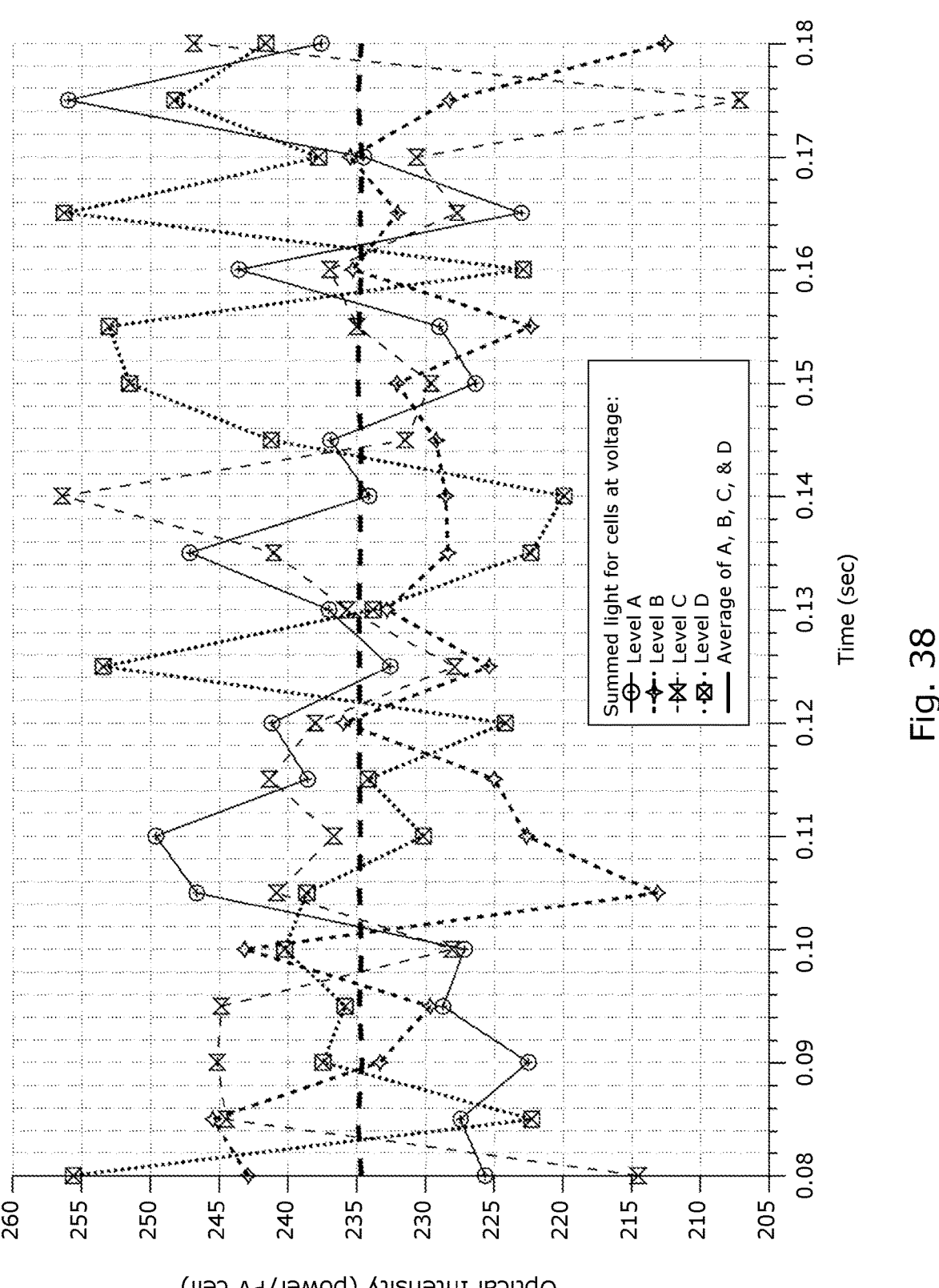
FIG. 38 shows light intensity vs. time for each of the four voltage levels shown in FIG. 7 during a representative 0.1 s time period.

Two arrangements of distributed voltage levels were modeled using the Py Spice model, the 4-level array shown in FIG. 7, which had a median Voronoi cell aspect ratio of 1.31, and the 8-level array shown in FIG. 35, which had a median Voronoi cell aspect ratio of 1.33. FIG. 38 shows light intensity vs. time (for each of the four voltage levels) for light incident on the array shown in FIG. 7 during a 0.1 s slice of the described simulation. It can be seen that while the intensity summed over each voltage level varies significantly, the average value is constant (since scintillation does not change the total light intensity, but simply "moves" parts of the beam from one location to another).

Figure 39A:
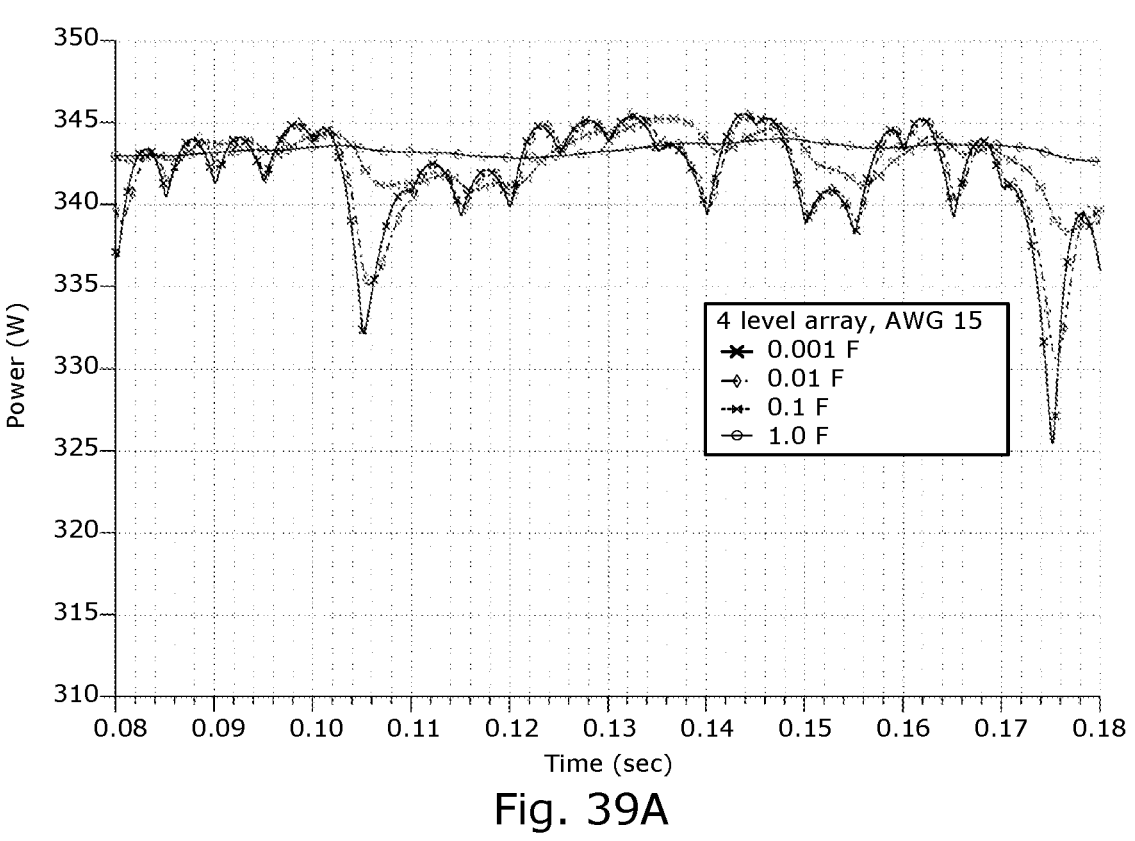
FIG. 39A shows power vs. time for the array and time period of FIG. 38 for four levels of capacitance for the array of FIG. 7.
Figure 39B:
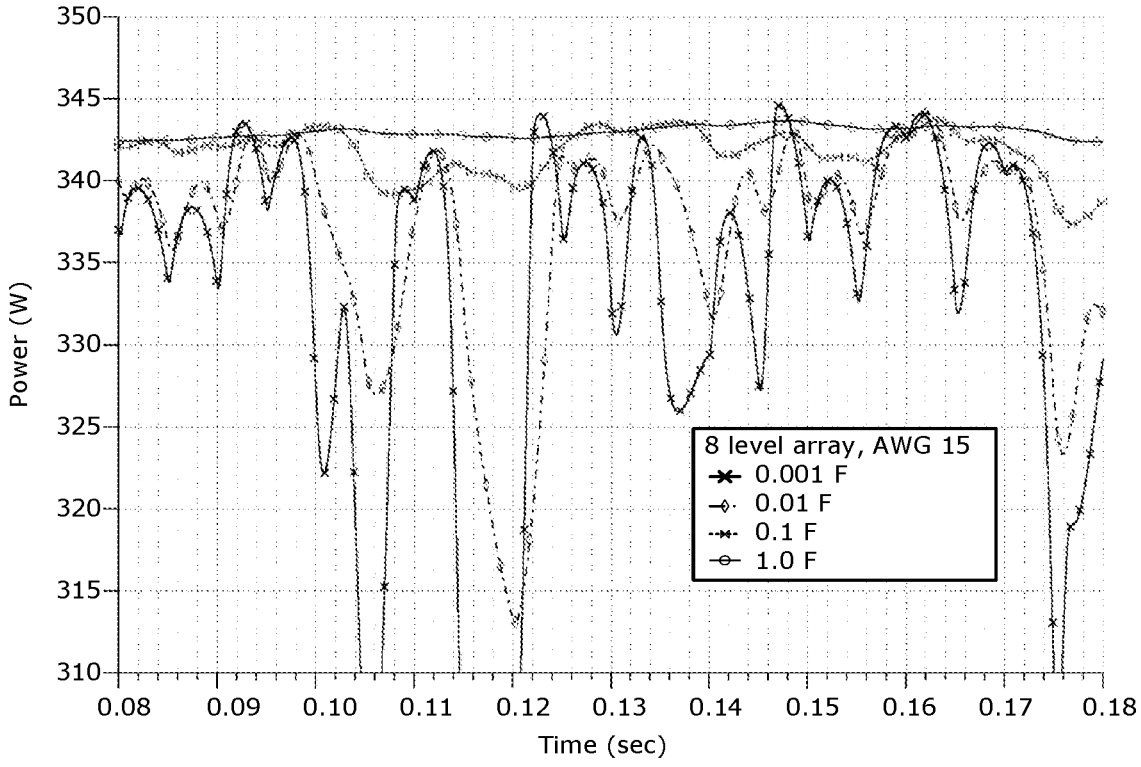
FIG. 39B shows the same data for the array of FIG. 35. These two figures may be collectively referred to herein as FIG. 39.

FIG. 39 shows instantaneous output power vs. time for 4 values of capacitance for capacitors 3410, ranging from 0.001 F to 1.0 F, for a wire gauge of 15, during the same representative time slice shown in FIG. 38. FIG. 39A shows output power vs. time for the array shown in FIG. 7, and FIG. 39B shows output power vs. time for the array shown in FIG. 35. As in the simpler simulation shown in FIG. 30-FIG. 32, it can be seen that increasing the amount of capacitance does reduce the variation in power produced by the array in both arrangements. This effect is substantially more pronounced for the 8-level array (with 8 PV cells at each voltage level) than for the 4-level array (with 16 PV cells at each voltage level). Those of ordinary skill in the art will recognize that the inventive distributed wiring arrangements described herein may benefit more from addition of capacitance when there are fewer PV cells in a parallel wiring group.

Figure 40A:
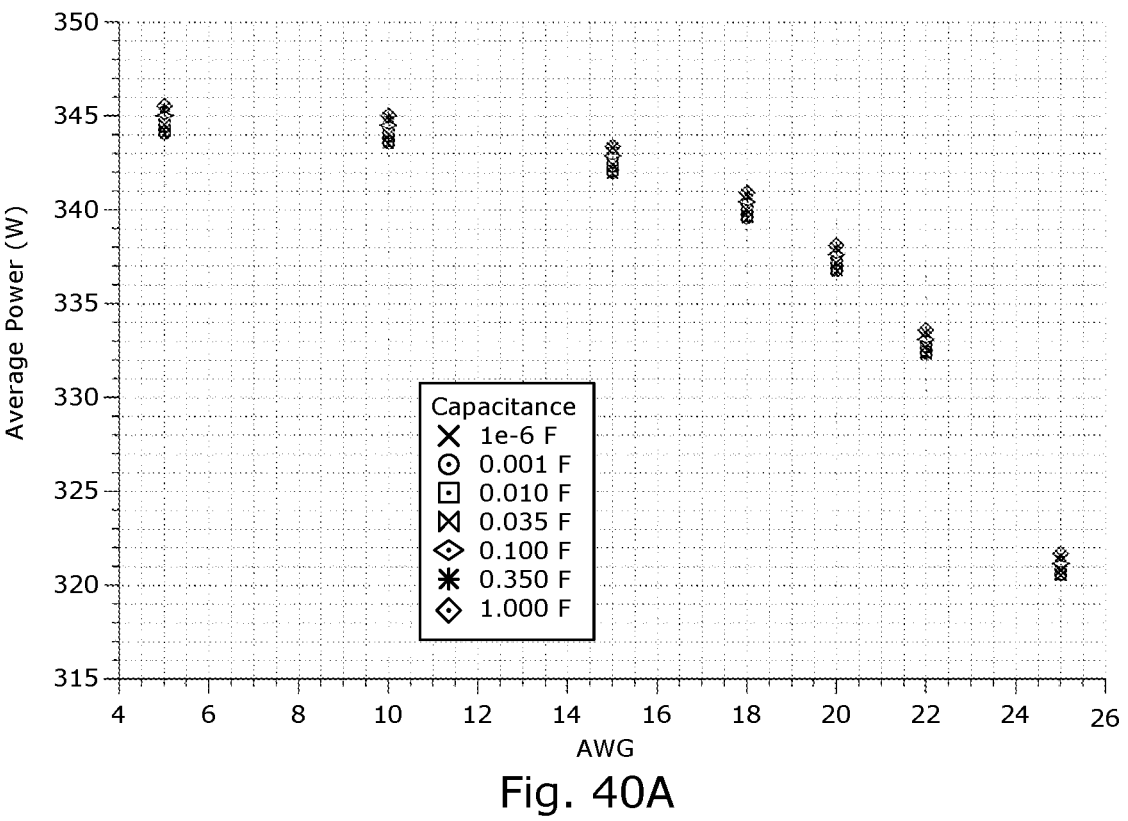
FIG. 40A shows the integrated power over the time slice shown in FIG. 38 for the layout of FIG. 7 for a range of capacitance values, plotted against the wire gauge used.
Figure 40B:
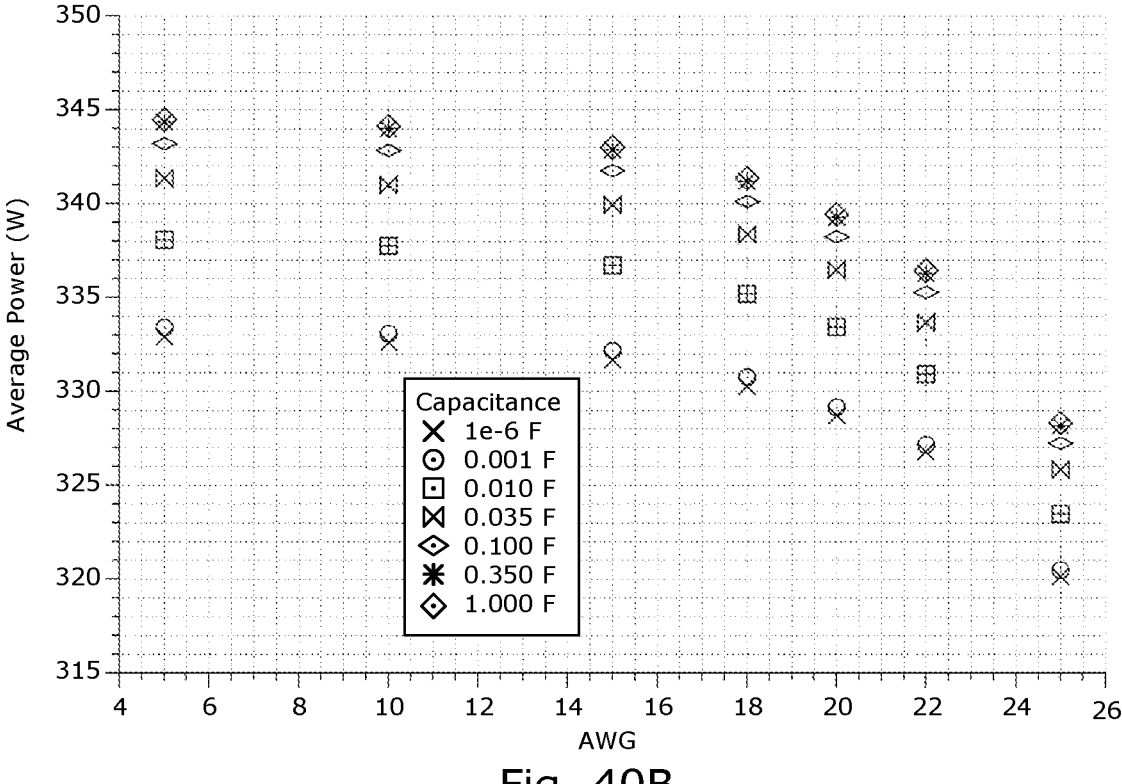
FIG. 40B shows the same data for the layout of FIG. 35. These two figures may be collectively referred to herein as FIG. 40.

FIG. 40A shows the power integrated over the time slice shown in FIG. 38 for the 4-level array of FIG. 7, plotted against the modeled wire gauge, for capacitance values ranging from 1 μF to 1 F. It will be seen that the amount of capacitance has a relatively modest effect on the integrated output power, but that using heavier gauge wires substantially increases the amount of power produced by the array. In contrast, FIG. 40B shows the power integrated over the same time slice for the 8-level array of FIG. 35. As also seen in FIG. 39, the 8-level array was much more sensitive to the amount of capacitance in the model. This array also produces more power at heavier wire gauges, but this effect is less pronounced than it is for the 4-level array.

Figure 41A:
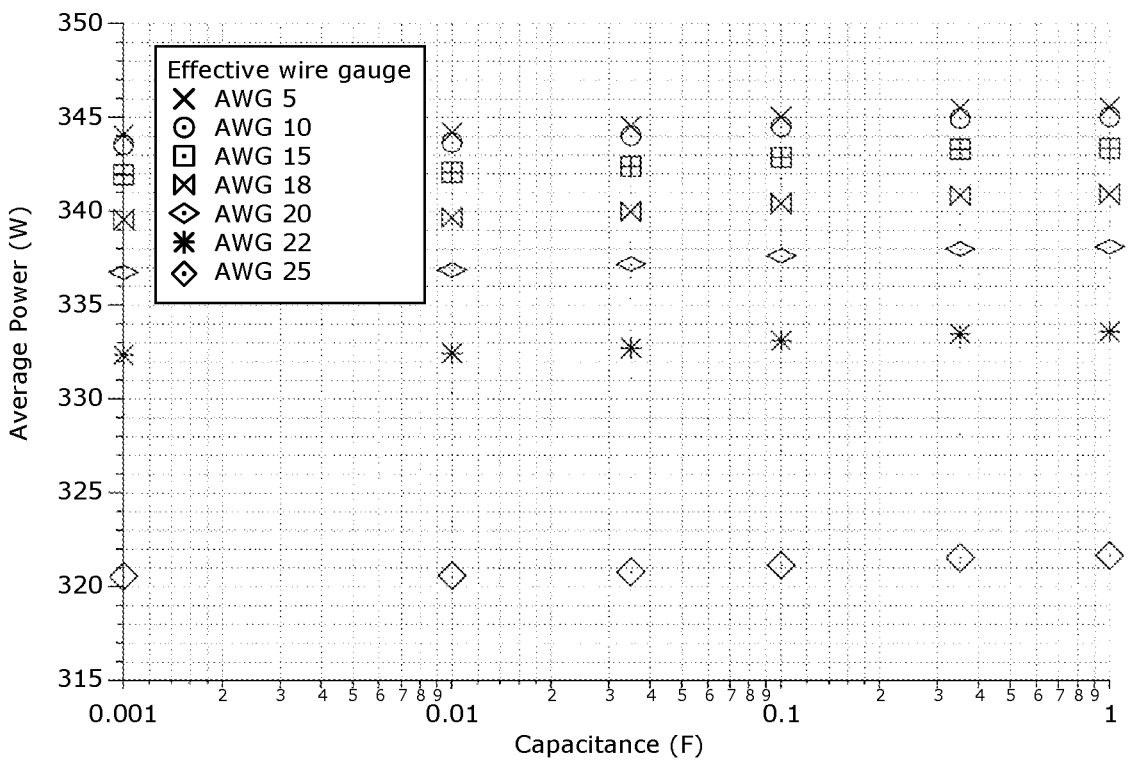
FIG. 41A shows the integrated power over the time slice shown in FIG. 38 for the layout of FIG. 7 for a range of wire gauge values, plotted against the capacitance.
Figure 41B:
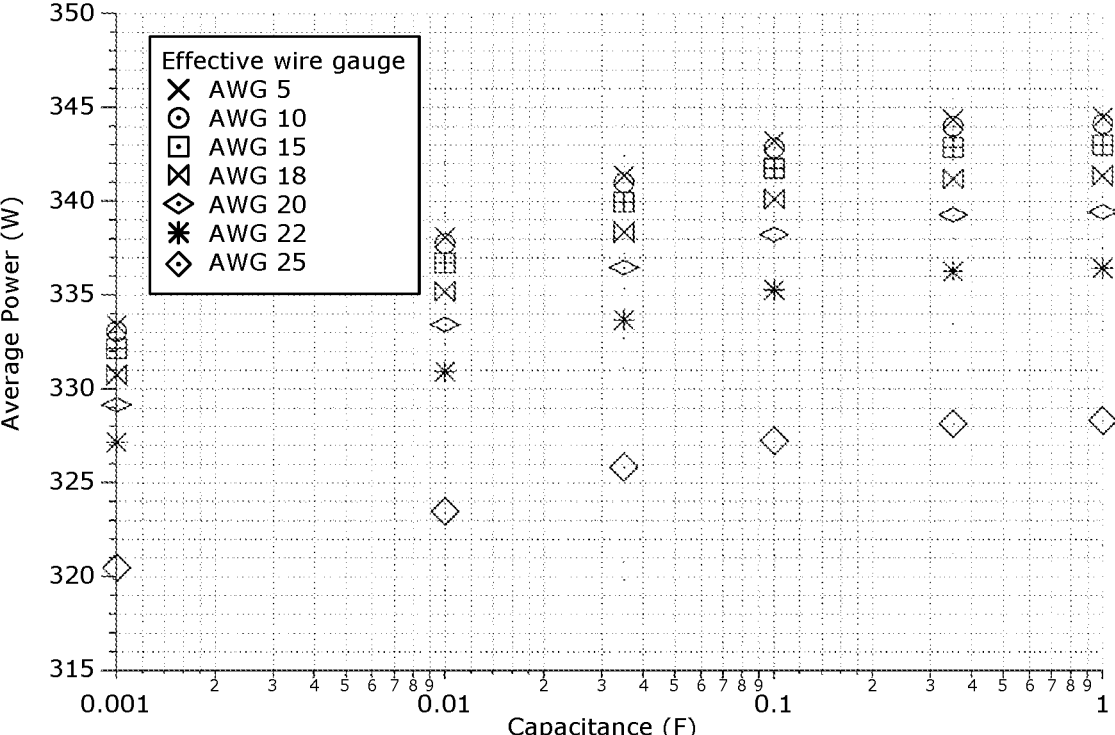
FIG. 41B shows the same data for the layout of FIG. 35. These two figures may be collectively referred to herein as FIG. 41.

FIG. 41A shows the power integrated over the same time slice, but plotting output power vs. capacitance (on a log scale), for each of the modeled wire gauges for the 4-level array. FIG. 41B shows the same data for the 8-level array. Like FIG. 40, these figures make clear that capacitance has fairly modest effect for the 4-level array, but that reducing the wire gauge (i.e., improving conductivity of the connections) substantially improves output power, while for the 8-level array, capacitance has a more pronounced effect (at least up to about 0.1-0.3 F), but heavier wire gauges do less to improve the output power from the array. Stated another way, for the lowest-resistance wires (AWG 5), increasing the capacitance from 1 μF to 1 F increases the average output power by about 2.5% for the 4-level array and about 3.5% for the 8-level array, while for the highest-resistance wires (AWG 25), increasing the capacitance from 1 μF to 1 F increases the average output power by about 0.35% for the 4-level array or 0.43% for the 8-level array. For a specific array for a real-world application, this type of modeling should prove useful for selecting correct-sized capacitors and connectors.

Changes that are contemplated but have not yet been modeled include increasing the size of the modeled array, using different sizes of capacitors and/or resistors in regions expected to receive more or less illumination, modeling the more complicated connectivity of connecting PV cells in a voltage level using a "sheet" of conductive material instead of wires, changing the expected speed and/or intensity of scintillation, using more complicated intensity patterns, allowing overall intensity to vary (perhaps at a different rate than used in simulating scintillation), and adding wander of a power beam (in addition to or in place of scintillation). Such additional modeling might allow us to identify appropriate analytical relationships to guide the choice of resistance and capacitance values for a particular implementation.

In the following, further features, characteristics, and advantages are described by items:

Item 1: A power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor in parallel with at least one PV cell of the plurality. The PV cells of each voltage group are arranged to be not adjacent to one another on the support surface, and the plurality of voltage groups exhibits a current mismatch of less than 5% when the receiver is exposed to a power beam, where current mismatch is defined as the difference between the greatest output current and the least output current, divided by the average output current. This type of power receiver may provide a technical benefit of improving power conversion efficiency by reducing current mismatch.

Item 2: The power receiver of item 1, where the capacitor has a capacitance greater than 0.01 F.

Item 3: The power receiver of item 1 or 2, where the capacitor has a capacitance greater than 0.1 F.

Item 4: The power receiver of any of items 1-3, where the capacitor has a capacitance greater than 0.5 F.

Item 5: The power receiver of any of items 1-4, where the capacitor has a capacitance greater than 1 F.

Item 6: The power receiver of any of items 1-5, further including a second capacitor connected in parallel with at least a second PV cell of the plurality of PV cells.

Item 7: The power receiver of any of items 1-6, where the power beam is a laser power beam.

Item 8: The power receiver of any of items 1-7, where the current mismatch is less than 4%.

Item 9: The power receiver of any of items 1-8, where the current mismatch is less than 3%.

Item 10: The power receiver of any of items 1-9, where the current mismatch is less than 2%.

Item 11: The power receiver of any of items 1-10, where the current mismatch is less than 1%.

Item 12: A power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor in parallel with at least one PV cell of the plurality. The PV cells of each voltage group are arranged in a repeating pattern along a first axis of the PV array, the repeating pattern being staggered along a second axis of the PV array by an offset value. The offset value is selected so that PV cells in the same voltage group are not adjacent to one another. This type of power receiver may provide a technical benefit of improving power conversion efficiency by reducing current mismatch.

Item 13: The power receiver of item 12, where the capacitor has a capacitance greater than 0.01 F.

Item 14: The power receiver of item 12 or 13, where the capacitor has a capacitance greater than 0.1 F.

Item 15: The power receiver of any of items 12-14, where the capacitor has a capacitance greater than 0.5 F.

Item 16: The power receiver of any of items 12-15, where the capacitor has a capacitance greater than 1 F.

Item 17: The power receiver of any of items 12-16, further including a second capacitor connected in parallel with at least a second PV cell of the plurality of PV cells.

Item 18: A power receiver includes a plurality of photovoltaic (PV) cells disposed on a support surface and electrical wiring for interconnecting the PV cells. The PV cells are divided into a plurality of voltage groups, each voltage group having a selected output voltage and output current. The wiring is configured to connect each PV cell within a voltage group in parallel and to connect each voltage group to at least one other voltage group in series. The receiver further includes a capacitor in parallel with at least one PV cell of the plurality. Each voltage group has the property that a Voronoi mesh generated from positions of PV cells in the voltage group has a median Voronoi cell aspect ratio of less than 1.4. This type of power receiver may provide a technical benefit of improving power conversion efficiency by reducing current mismatch, by ensuring that PV cells in a voltage level are distributed evenly across the array surface.

Item 19: The power receiver of item 18, where the capacitor has a capacitance greater than 0.01 F.

Item 20: The power receiver of item 18 or 19, where the capacitor has a capacitance greater than 0.1 F.

Item 21: The power receiver of any of items 18-20, where the capacitor has a capacitance greater than 0.5 F.

Item 22: The power receiver of any of items 18-21, where the capacitor has a capacitance greater than 1 F.

Item 23: The power receiver of any of items 18-22, further including a second capacitor connected in parallel with at least a second PV cell of the plurality of PV cells.

Item 24: The power receiver of item 18, where each voltage group has the property that a Voronoi mesh generated from positions of PV cells in the voltage group has a median Voronoi cell aspect ratio of less than 1.3.

While the foregoing has described what are considered to the best mode and/or other examples, it is understood that various modifications may be made therein, and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Precision of values is indicated by number of digits after a decimal point (so that 1.00 is more precise than 1.0) in a manner customary in the art, unless context dictates otherwise.

The scope of protection is limited solely by the claims that now follow. That scope is intended to be as broad as is consistent with the ordinary meanings of the language that is used in the claims when interpreted in light of this specification and the prosecution history that follows and to encompass all structural and functional equivalents. Notwithstanding, none of the claims are intended to embrace subject matter that fails to satisfy the requirements of Sections 101, 102, or 103 of the Patent Act, nor should they be interpreted in such a way. Any unintended embracement of such subject matter is hereby disclaimed.

Except as stated in the previous paragraph, nothing that has been stated or illustrated is intended or should be interpreted to cause a dedication of any component, step, feature, objects, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity from another without necessarily implying any relationship or order between such entities. The terms "comprise" and "include" in all their grammatical forms are intended to cover a non-exclusive inclusion, so that a process, method, article, apparatus, or composition of matter that comprises or includes a list of elements may also include other elements not expressly listed. An element preceded by "a" or "an" does not, without further constraints, preclude the existence of additional identical or similar elements.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in various examples for the purpose of clarity of explanation. This method of disclosure is not to be interpreted as reflecting an intention that the claims require more features than are expressly recited in each claim. Furthermore, features from one example may be freely included in another, or substituted for one another, without departing from the overall scope and spirit of the instant application.

What is claimed is:

1. A power receiver, comprising:
   a plurality of photovoltaic (PV) cells disposed on a support surface to form a PV array, the PV cells divided into a plurality of voltage groups; and
   electrical wiring for interconnecting the PV cells, the wiring configured to:
      connect each PV cell within a voltage group in parallel; and
      connect each voltage group to at least one other voltage group in series; and
   a capacitor connected in parallel with at least one PV cell of the plurality of PV cells, wherein:
   the PV cells of each voltage group are arranged in a repeating pattern along a first axis of the PV array; and
   the repeating pattern is staggered along a second axis of the PV array by an offset value, the offset value selected so that PV cells in the same voltage group are not adjacent to one another.

2. The power receiver of claim 1, wherein the capacitor has a capacitance greater than 0.01 F.

3. The power receiver of claim 1, wherein the capacitor has a capacitance greater than 0.1 F.

4. The power receiver of claim 1, wherein the capacitor has a capacitance greater than 0.5 F.

5. The power receiver of claim 1, wherein the capacitor has a capacitance greater than 1 F.

6. The power receiver of claim 1, further comprising a second capacitor connected in parallel with at least a second PV cell of the plurality of PV cells.

7. A power receiver, comprising:
   a plurality of photovoltaic (PV) cells disposed on a support surface to form a PV array, the PV cells divided into a plurality of voltage groups; and
   electrical wiring for interconnecting the PV cells, the wiring configured to:
      connect each PV cell within a voltage group in parallel; and
      connect each voltage group to at least one other voltage group in series; and
   a capacitor connected in parallel with at least one PV cell of the plurality of PV cells,
   wherein each voltage group has the property that a Voronoi mesh generated from positions of PV cells in the voltage group has a median Voronoi cell aspect ratio of less than 1.4.

8. The power receiver of claim 7, wherein the capacitor has a capacitance greater than 0.01 F.

9. The power receiver of claim 7, wherein the capacitor has a capacitance greater than 0.1 F.

10. The power receiver of claim 7, wherein the capacitor has a capacitance greater than 0.5 F.

11. The power receiver of claim 7, wherein the capacitor has a capacitance greater than 1 F.

12. The power receiver of claim 7, further comprising a second capacitor connected in parallel with at least a second PV cell of the plurality of PV cells.

13. The power receiver of claim 7, wherein each voltage group has the property that a Voronoi mesh generated from positions of PV cells in the voltage group has a median Voronoi cell aspect ratio between 1.3 and 1.4.

14. The power receiver of claim 7, wherein each voltage group has the property that a Voronoi mesh generated from positions of PV cells in the voltage group has a median Voronoi cell aspect ratio between 1.2 and 1.3.

15. The power receiver of claim 7, wherein each voltage group has the property that a Voronoi mesh generated from positions of PV cells in the voltage group has a median Voronoi cell aspect ratio between 1.0 and 1.2.

* * * * *